United States Patent
Sullivan et al.

(10) Patent No.: US 11,522,565 B2
(45) Date of Patent: Dec. 6, 2022

(54) PACKED ERROR CORRECTION CODE (ECC) FOR COMPRESSED DATA PROTECTION

(71) Applicant: NVIDIA Corporation, Santa Clara, CA (US)

(72) Inventors: Michael Brendan Sullivan, Austin, TX (US); Jeffrey Michael Pool, Chapel Hill, NC (US); Yangxiang Huang, San Jose, CA (US); Timothy Kohchih Tsai, Santa Clara, CA (US); Siva Kumar Sastry Hari, Sunnyvale, CA (US); Steven William Keckler, Austin, TX (US)

(73) Assignee: NVIDIA Corporation, Santa Clara, CA (US)

( * ) Notice: Subject to any disclaimer, the term of this patent is extended or adjusted under 35 U.S.C. 154(b) by 23 days.

(21) Appl. No.: 17/224,434

(22) Filed: Apr. 7, 2021

(65) Prior Publication Data
US 2022/0329265 A1    Oct. 13, 2022

(51) Int. Cl.
| | | |
|---|---|---|
| G11C 29/00 | (2006.01) | |
| H03M 13/00 | (2006.01) | |
| G06F 11/10 | (2006.01) | |
| G06F 13/40 | (2006.01) | |
| G06F 9/455 | (2018.01) | |
| G06N 3/04 | (2006.01) | |

(52) U.S. Cl.
CPC ..... *H03M 13/6312* (2013.01); *G06F 11/1076* (2013.01); *G06F 13/4027* (2013.01); *G06F 9/45558* (2013.01); *G06N 3/04* (2013.01)

(58) Field of Classification Search
CPC ............ H03M 13/6312; G06F 11/1076; G06F 13/4027; G06F 9/45558; G06N 3/04
See application file for complete search history.

(56) References Cited

U.S. PATENT DOCUMENTS

| | | | |
|---|---|---|---|
| 8,495,464 B2 | 7/2013 | Stracovsky et al. | |
| 2011/0314231 A1* | 12/2011 | O'Connor | G06F 12/04 711/E12.001 |

OTHER PUBLICATIONS

Chen, L., et al., "Free ECC: An Efficient Error Protection for Compressed Last-Level Caches," in Computer Design (ICCD), 2013 IEEE 31$^{st}$ International Conference.

(Continued)

*Primary Examiner* — Samir W Rizk
(74) *Attorney, Agent, or Firm* — Leydig, Voit & Mayer, Ltd.

(57) ABSTRACT

A packed error correction code (ECC) technique opportunistically embeds ECC check-bits with compressed data. When compressed, the data is encoded in fewer bits and is therefore fragmented when stored or transmitted compared with the uncompressed data. The ECC check-bits may be packed with compressed data at "source" points. The check-bits are transmitted along with the compressed data and, at any "intermediate" point between the source and a "destination" the check-bits may be used to detect and correct errors in the compressed data. In contrast with conventional systems, packed ECC enables end-to-end coverage for sufficiently-compressed data within the processor and also externally. While storage circuitry typically is protected by structure-specific ECC, protection is also beneficial for data as it is transmitted between processing and/or storage units.

20 Claims, 15 Drawing Sheets

(56) References Cited

OTHER PUBLICATIONS

Palframan, D.J., et al., "COP: To Compress and Protect Main Memory," in Proceedings of the $42^{nd}$ Annual International Symposium on Computer Architecture, New York, NY 2015, pp. 682-693.
Kim, J., et al., "Frugal ECC: Efficient and Versatile Memory Error Protection through Fine-Grained Compression," in Proceedings of the International Conference on High Performance Computing, Networking, Storage and Analysis (SC), 2015.

* cited by examiner

PACKED ERROR CORRECTION CODE (ECC) FOR COMPRESSED DATA PROTECTION

BACKGROUND

Structure-specific error correction code (ECC) is provided to detect and correct errors within memory devices, but the ECC is not available externally. Wide interfaces of modern memory devices preclude the use of a dedicated ECC chip between the memory devices and a processor. Therefore, processors provide ECC support using address mapping to carve out dedicated portions of the memory to store ECC codes—referred to as "embedded" or "inline" ECC. Drawbacks of conventional inline ECC are that many data accesses also require a separate ECC access, increasing memory bandwidth usage and power consumption compared with only accessing the data. There is a need for addressing these issues and/or other issues associated with the prior art.

SUMMARY

Embodiments of the present disclosure relate to packed error correction code for compressed data protection. Systems and methods are disclosed that opportunistically pack ECC check-bits with compressed data at "source" points. The check-bits are transmitted along with the compressed data and, at any "intermediate" point between the source and a "destination" the check-bits may be used to detect and correct errors in the compressed data. In contrast with conventional systems, such as those described above, the packed ECC enables end-to-end coverage for sufficiently-compressed data within the processor and also externally. While storage circuitry typically is protected by structure-specific ECC, protection is also beneficial for data as it is transmitted between processing and/or storage units. In particular, it is desirable to provide protection for the crossbar structure.

A method, computer readable medium, and system are disclosed for packed error correction code for compressed data protection. In an embodiment, compressed data is processed within a processor to compute error correction code check-bits and a number of fixed size storage units needed to store a combination of the compressed data and check-bits is determined. In an embodiment, the number of fixed size storage units is a minimum number in in which all of the compressed data and check-bits fit. In an embodiment, the compressed data and the check-bits are combined into the number for transfer within the processor or to an additional device that is external to the processor. In an embodiment, the combination is transmitted to a storage resource within the processor, and based on the check-bits, a determination is made whether the compressed data is corrupted. The combination is stored in the storage resource, and, when the compressed data is corrupted, the compressed data is corrected using the check-bits either before or after the combination is stored.

BRIEF DESCRIPTION OF THE DRAWINGS

The present systems and methods for protecting compressed data using packed ECC are described in detail below with reference to the attached drawing figures, wherein.

DETAILED DESCRIPTION

Figure 1A:
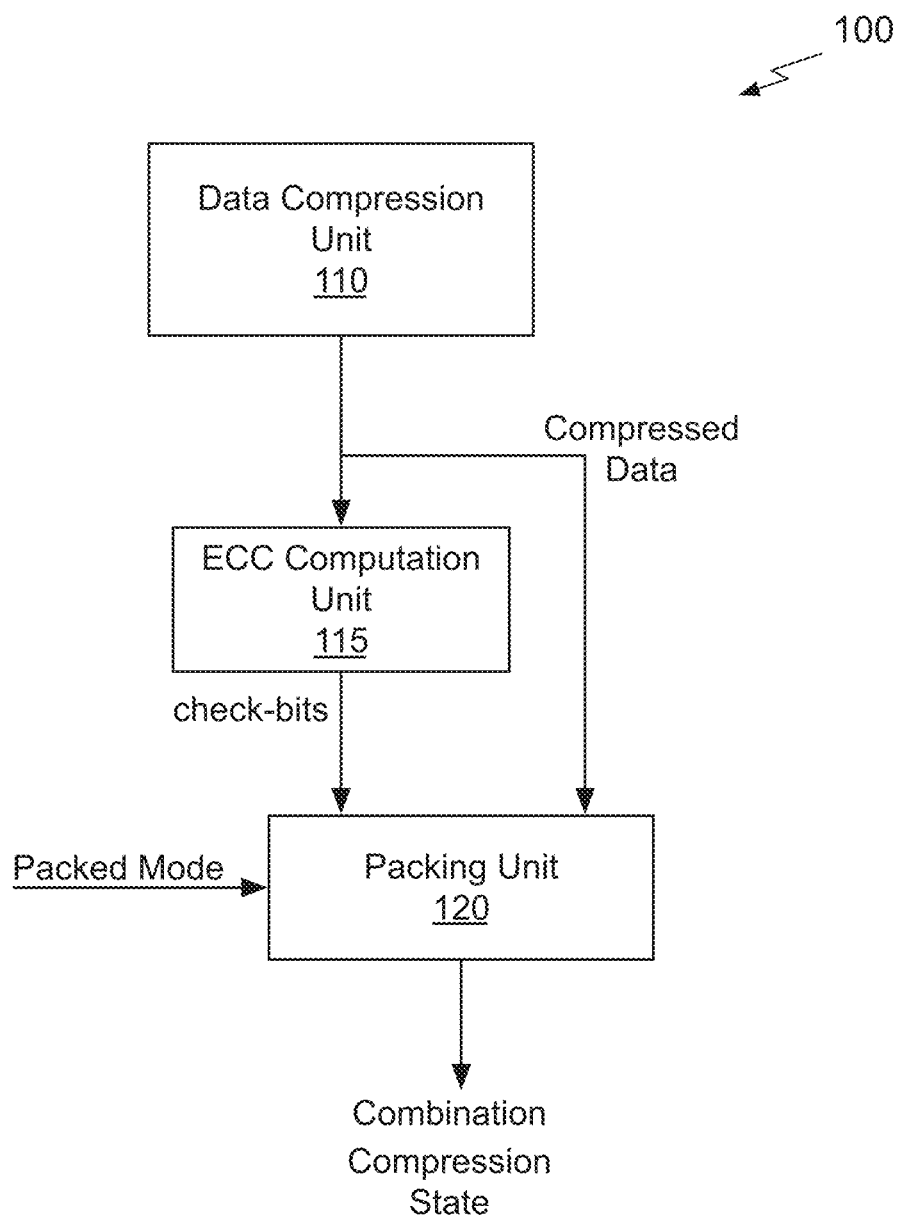
FIG. 1A illustrates a block diagram of example ECC and compressed data packing logic suitable for use in implementing some embodiments of the present disclosure.

Systems and methods are disclosed related to packed ECC for compressed data protection. ECC check-bits may be computed for the compressed data and combined with the compressed data into a packed format using a number of bits that is equal or less compared with the uncompressed data. Packed ECC compressed data may be transmitted within a processor or external to the processor. The embedded check-bits may be used to detect and correct errors in the compressed data at any point within the processor or by an external device that receives the packed ECC compressed data. Therefore, in addition to providing protection within the processor, the packed ECC may also be used to protect the compressed data that is transmitted outside of the processor. Conversely, the processor may receive packed ECC data and detect and correct any errors in the received data that is compressed.

Representing data in a compressed format may reduce power, particularly when accessing memory that stores the compressed data. Compressed data may also improve performance when performance is bandwidth limited by enabling more data to be transferred for each transaction. Combining ECC check-bits with the compressed data provides protection with minimal or no modifications to existing caches and storage within the processor, interfaces, and external memory devices. For example, dedicated storage and routing circuitry is not needed for the packed ECC check-bits because the check-bits are embedded with the compressed data—occupying bits that are otherwise unused due to compression. Protection provided by ECC improves resilience and may be needed for safety certification and/or to meet reliability requirements.

Conventionally, data in main memory and large storage arrays are protected by structure-specific ECC. Inline error detection or correction using ECC is provided for main memory by devoting a fixed amount of memory capacity for the ECC check-bits. The fixed amount is unavailable for storing other data, effectively reducing the main memory capacity. Additionally, reading and writing the ECC check-bits consumes additional memory bandwidth and power. There is also management overhead to map the ECC check-bits address space and generate additional transactions (e.g., memory accesses) to access the ECC check-bits. Furthermore, in processors, such as graphics processing units (GPUs), the ECC check-bits are not generally transmitted from one structure to the next, leaving coverage holes between the ECC decoder of one structure in the memory hierarchy and the ECC encoder of the next structure in the memory hierarchy.

In contrast with conventional solutions, packed ECC compressed data only requires dedicated ECC storage when the check-bits cannot be combined with the compressed data due to insufficient compression. Therefore, when the check-bits are successfully combined with the compressed data, memory bandwidth and power consumption for memory accesses are reduced compared with inline ECC implementations. In particular, the combination of the compressed data and check-bits may be stored in the memory at a location accessed by a single address and read or written using a single access request. Furthermore, ECC coverage may be extended through the memory hierarchy and across multiple structures, reducing or eliminating coverage holes and providing the possibility for end-to-end protection.

FIG. 1A illustrates a block diagram of example ECC and compressed data packing logic 100 suitable for use in implementing some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory. Furthermore, persons of ordinary skill in the art will understand that any system that performs the operations of the ECC and compressed data packing logic 100 is within the scope and spirit of embodiments of the present disclosure.

As shown in FIG. 1A a data compression unit 110 compresses data and an ECC computation unit 115 computes ECC check-bits for the compressed data. The compression operation performed by the data compression unit 110 is decoupled from the ECC check-bit computation and packing operations. The data compression unit 110 may be in a separate processing or execution unit with one or more storage and/or transmission circuits between the data compression unit 110 and the ECC computation unit 115. However, to best protect the compressed data, the check-bits should be computed at the output of the data compression unit 110 to ensure that the compressed data is not corrupted before the check-bits are computed.

A packing unit 120 packs the check-bits and the compressed data into the smallest possible number of fixed sized storage units, e.g., atoms. In an embodiment, each atom is 32 bytes and uncompressed data is four atoms. Depending on how compressible the data is, the compressed data may fit in one, two, three, or four atoms. In an embodiment, the check-bits that are computed for each atom of data are 2 bytes, so 8 bytes of check-bits are computed for four atoms of compressed data. In an embodiment, a number of atoms needed to store a combination of the compressed data and check-bits is determined. In an embodiment the number of atoms is a minimum number of atoms in which the entire combination fits. It is possible that a second number of atoms needed to store the compressed data without the check-bits is less than the number of atoms needed to store the combination of the compressed data and the check-bits. The packing unit 120 outputs the combination and compression state. The compression state may be stored in a memory mapping unit, in a reserved meta-data memory region (possibly with a separate cache hierarchy), and/or transmitted with the combination. In an embodiment, the compression state indicates whether or not the check-bits are successfully packed with the compressed data in the combination and the number of atoms which the combination occupies. In an embodiment, the compression state also indicates the compression format used to compress the data and that is needed to decompress the compressed data.

In an embodiment, the compression state is augmented with states to support both packed and unpacked variants of each compression size. For example, a single bit of the compression state may indicate whether or not the check-bits are packed with the compressed data and the compression format is encoded in the remaining bits of the compression state. Therefore, the compressed data is encoded in the same bits regardless of whether the check-bits are packed with the compressed data or not. In an embodiment, when the compression state indicates packing is unsuccessful, the separately stored check-bits may be pre-fetched as a block to reduce the number of check-bit read accesses to benefit from packing failure locality.

When packing is successful, the compression state is a packed compression state that indicates the number of atoms in which the combination fits and the possible packed compression states may depend on a mode setting. In an embodiment, a maximum number of atoms is four and four possible packed compression states are supported, one, two, three, and four atoms. The maximum number and the packed compression states are controlled by a packed mode input to the packing unit 120. The packed mode may be fixed, programmed, or configured according to a setting or context. In another embodiment, the maximum number of atoms is four and only two possible packed compression states are supported, two and four atoms. In an embodiment, packing is unsuccessful when the number of atoms needed to store the combination is greater than the maximum number of atoms. When packing fails, the combination of the check-bits and the compressed data is not packed and the compression state is "not packed".

When the compression state is not packed, the check-bits and the compressed data are separately stored and transmitted. In another embodiment, when the compression state is not packed, the check-bits are removed from the combination and discarded, so that the check-bits are not available for error detection and correction. In an embodiment, the maximum number of atoms is large enough to store uncompressed data packed with the check-bits. When the maximum number is large enough to store uncompressed data packed with the check-bits, the maximum number is also large enough to store all combinations of compressed data and the check-bits, regardless of the compression rate or compressibility of the data. Therefore, the not packed compression state implicitly indicates that the compressed data occupies the maximum number of atoms.

More illustrative information will now be set forth regarding various optional architectures and features with which the foregoing framework may be implemented, per the desires of the user. It should be strongly noted that the following information is set forth for illustrative purposes and should not be construed as limiting in any manner. Any of the following features may be optionally incorporated with or without the exclusion of other features described.

Figure 1B:
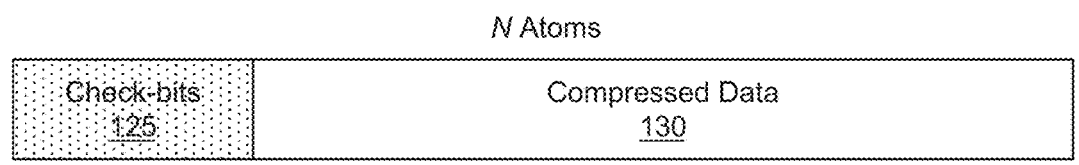
FIG. 1B illustrates a format for packed ECC check-bits and compressed data suitable for use in implementing some embodiments of the present disclosure.

FIG. 1B illustrates a format for encoding a combination of packed ECC check-bits 125 and compressed data 130 suitable for use in implementing some embodiments of the present disclosure. The format includes an integer number of N atoms, where 1≤N≤maximum. When the compressed data 130 occupies less than an integer number of atoms, the compressed data 130 is "fragmented" and the check-bits 125 may fill in the unoccupied bits. When the unoccupied bits are less than the number of bits in the check-bits 125, an additional atom may be included to pack the check-bits 125 with the compressed data 130. In an embodiment, the check-bits 125 are located in the same position within the format, regardless of the number of atoms that are used to encode the compressed data 130. For example, the check-bits 125 may always be in the most significant bits. In an embodiment, the unused bits are set to a constant or arbitrary value. In an embodiment, the unused bits are unchanged compared with the compressed data that is input to the ECC computation unit 115. In an embodiment, the unused bits are set to values that minimize toggling (e.g., signal switching) of a bus on which the combination is transmitted.

Figure 1C:
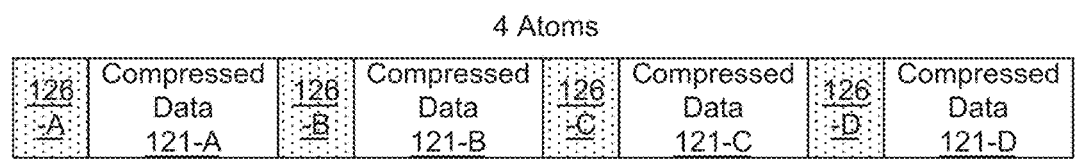
FIG. 1C illustrates an interleaved format for packed ECC check-bits and compressed data suitable for use in implementing some embodiments of the present disclosure.

FIG. 1C illustrates an interleaved format for encoding a combination of packed ECC check-bits 126 and compressed data 121 suitable for use in implementing some embodiments of the present disclosure. The format includes a maximum of four atoms where the compressed data 121 is interleaved with the check-bits 128. The check-bits 126-A are computed for the compressed data 121-A and, in one embodiment, the compressed data 121-A is produced by compressing one atom of data. If the combination of compressed data 121-A and the check-bits 126-A exceeds one atom packing fails. Likewise, the compressed data 121-B, 121-C, and 121-D are interleaved with their respective check-bits 126-B, 126-C, and 126-D.

An advantage of the interleaved format is that when fewer than four atoms are accessed, the compressed data 121 for each atom that is read can be verified using the corresponding check-bits 128 and, if needed, corrected independently. Similarly, if the four atoms are transmitted serially, the compressed data 121 for each atom can be verified and, if needed, corrected as it is received.

In an embodiment, the compression states include two or more unpacked compression states and corresponding packed compression states. For example, the packed compression states are 4:1 and 4:2 indicating that data occupying four atoms is compressed and, when combined with check-bits, occupies 1 and 2 atoms, respectively. In this example, when more than two atoms are needed for the combination of compressed data and check-bits, the packing fails. In another example, the packed compression states include 4:3 indicating that data occupying four atoms is compressed and, when combined with check-bits occupies three atoms. Similarly, when the packed compression states include 4:4, the data occupying four atoms is compressed and, when combined with check-bits occupies four atoms.

In an embodiment, the number of atoms is a compression size that is determined based only on the compressed data and, when the combination of the compressed data and check-bits cannot fit in the number, packing fails. In an embodiment, the number of atoms is a minimum number of atoms in which the compressed data fits. In an embodiment, when packing fails, the check-bits are removed from the combination and are transferred and/or stored separately from the compressed data. When either packing fails or ECC packing is not enabled, the unpacked compression states of 4:1, 4:2, 4:3, and 4:4 indicate that the data occupying four atoms is compressed into 1, 2, 3, and 4 atoms, respectively.

Figure 1D:
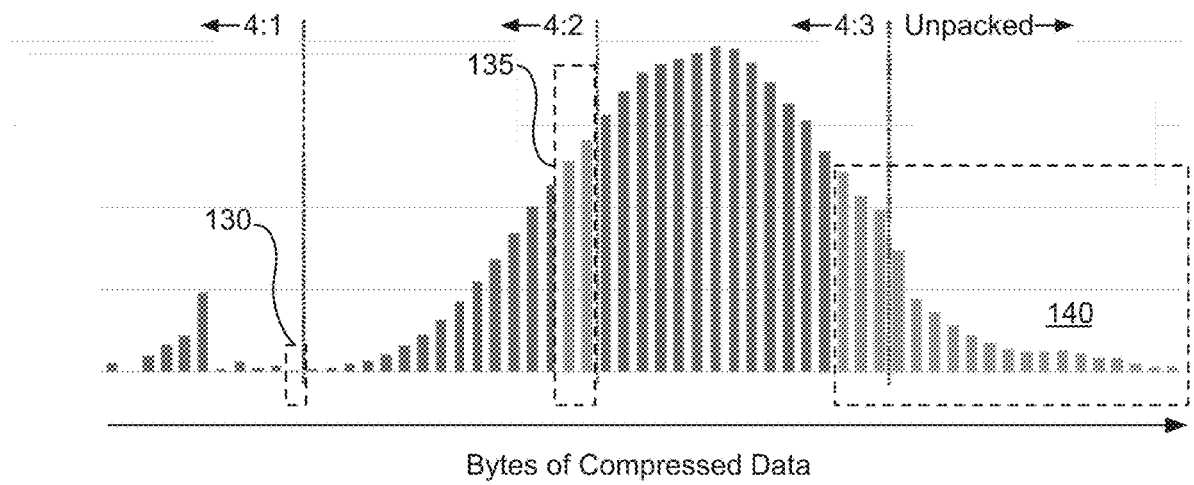
FIG. 1D illustrates a graph of packing success rates when three packed compression states are supported, according to some embodiments of the present disclosure.

FIG. 1D illustrates a graph of packing success rates when three packed compression states are supported, according to some embodiments of the present disclosure. The horizontal axis indicates the number of bytes in the compressed data. The vertical axis indicates an occurrence count for various compressed data of a processing workload. Compressed data 130 occupies more than 30 bytes of a 32 byte atom. Assuming that the check-bits for each 32 bytes of data requires 2 bytes, packing fails for the compressed data 130. For compressed data that occupies less than 32 bytes (towards the left along the horizontal axis), packing succeeds for a packed compression state of 4:1. When the compression size can be increased by an additional atom, the number of atoms for compressed data 130 is increased from one to two, and packing succeeds for a compression state of 4:2.

Compressed data 135 occupies more than 60 bytes of two atoms, and packing fails. Again, when the compression size can be increased, the number of atoms for compressed data 135 is increased from two to three, and packing succeeds for a compression state of 4:3. Compressed data 140 occupies more than 90 bytes of three atoms, so packing fails for compressed data 140. When the compression size cannot be increased, so that the compressed data 130, 135, and 140 have a compression state of unpacked, the packing success rate is 83%.

Figure 1E:
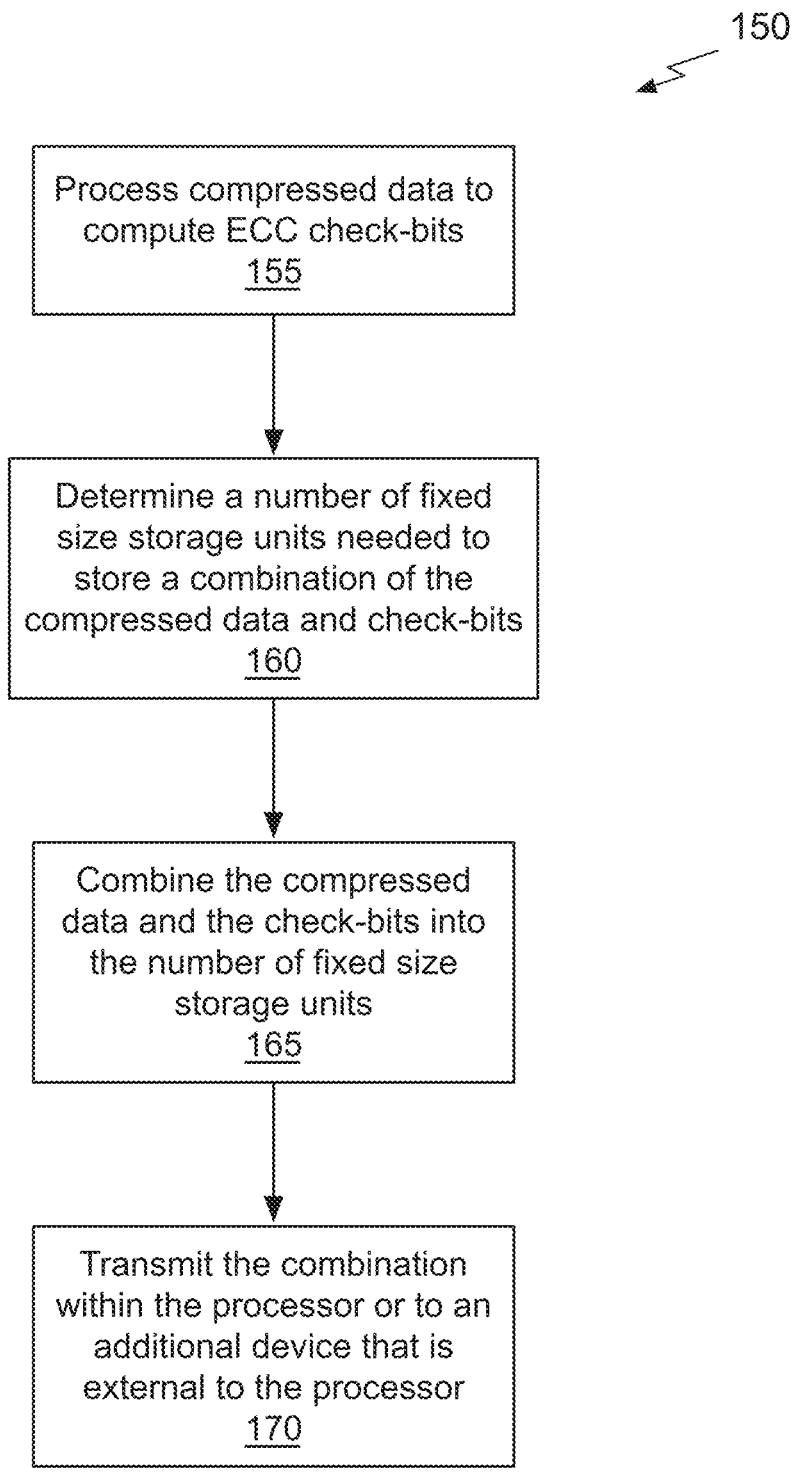
FIG. 1E illustrates a flowchart of a method for packing ECC check-bits for compressed data protection suitable for use in implementing some embodiments of the present disclosure.

FIG. 1E illustrates a flowchart of a method 150 for packing ECC check-bits for compressed data protection suitable for use in implementing some embodiments of the present disclosure. Each block of method 150, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 150 is described, by way of example, with respect to the logic of FIG. 1A. However, this method may additionally or alternatively be executed by any one system, or any combination of systems, including, but not limited to, those described herein. Furthermore, persons of ordinary skill in the art will understand that any system that performs method 150 is within the scope and spirit of embodiments of the present disclosure.

At step 155, compressed data is processed within a processor to compute ECC check-bits. In an embodiment, the ECC quality is fixed so that no additional state information is tracked or stored. In other words, in an embodiment, errors in the compressed data may be detected using only the compression state, compressed data, and the check-bits. In an embodiment, the compressed data is received from an additional device that is external to the processor. In an embodiment, the compressed data is generated within the processor.

At step 160, a number of fixed size storage units (e.g., atoms) needed to store a combination of the compressed data and check-bits is determined. In an embodiment, the number of fixed size storage units that is determined is a minimum number of fixed size storage units in which the entire combination fits. In an embodiment, a second number of the fixed size storage units needed to store the compressed data without the check-bits is less than the number needed to store the combination. In an embodiment, the ECC check-bits are separately computed for a portion of the compressed data in each fixed size storage unit and combined in the fixed size storage unit with the portion of the compressed data.

At step 165, the compressed data and the check-bits are combined into the number to produce a combination. At step 170, the combination is transmitted either within a processor or to an additional device that is external to the processor. In an embodiment, the check-bits are discarded at an interface with the additional device and only the compressed data is transmitted from the processor to the additional device. In an embodiment, the combination is stored in a memory device. In an embodiment, the combination is transmitted from the processor to the additional device over an interconnect. In an embodiment, the combination is transmitted through a crossbar interconnect within the processor.

In an embodiment, a maximum number of the fixed size units is defined and, when the number is greater than the maximum number, the check-bits are removed from the combination. When the check-bits are removed, the check-bits may be transferred within the processor or to the additional device separately from the compressed data. In an embodiment, the compressed data is stored in a first portion of a memory device and the check-bits are stored in a second portion of the memory device that is separate from the first portion.

Figure 2A:
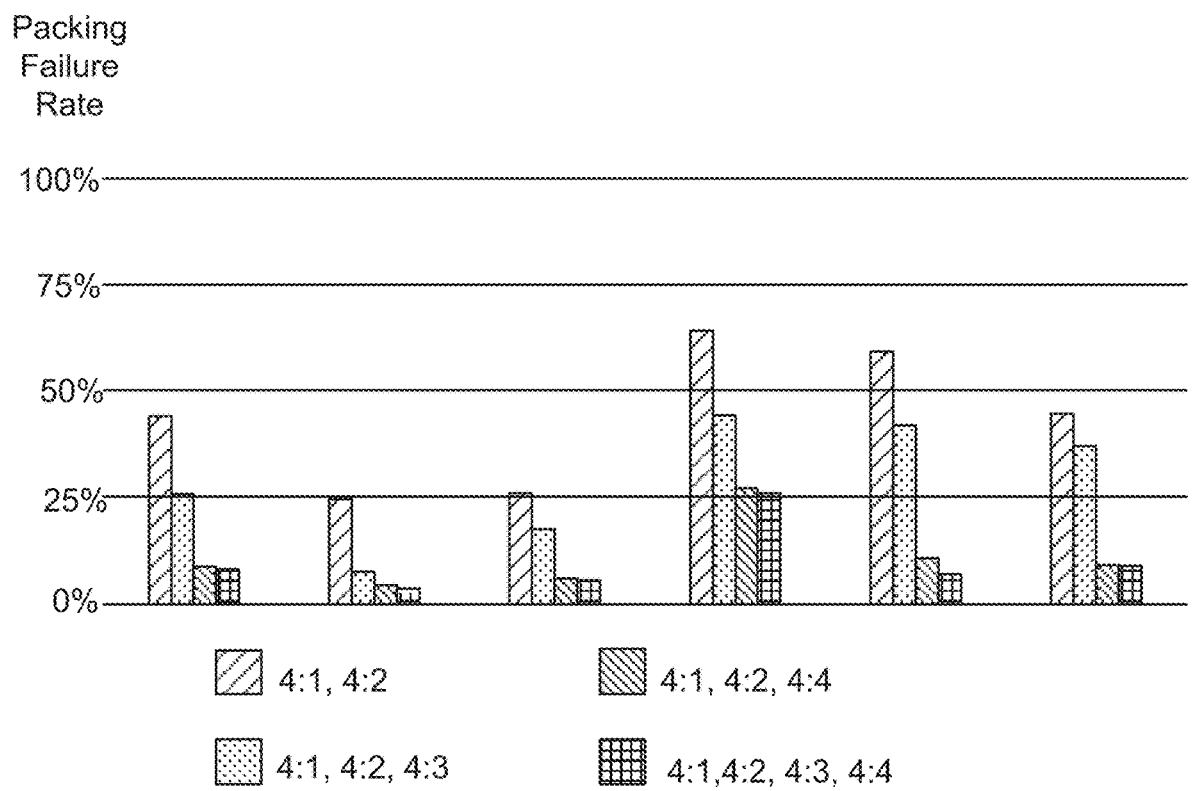
FIG. 2A illustrates a graph of failure rates for various packed formats suitable for use in implementing some embodiments of the present disclosure.

FIG. 2A illustrates a graph of failure rates for various packed formats suitable for use in implementing some embodiments of the present disclosure. Each set of four bars corresponds to the packing failure rate during execution of one program. The leftmost bar in each set is for the packed compression states (4:1 and 4:2) and the resulting packing failure rate is on average, less than 50%. When packing fails, the check-bits are stored separately from the compressed data (e.g., inline ECC). Therefore, compared with conventional inline ECC, the extra accesses for separately stored check-bits will be elided more than half of the time. Adding the 4:3 compression state results in close to a 20% average packing failure rate, eliding 4/5 of the ECC accesses compared with conventional inline ECC.

The two rightmost bars for each set include a specialized 4:4 packed compression state. The specialized just-enough 4:4 packed compression amplifies the packing success rate for marginally compressible data, especially floating-point data. The marginally compressible data compresses enough to pack the check-bits into the maximum number of atoms, but is not sufficient for bandwidth compression.

In an embodiment, a specialized compressor operates at a small 32 byte compression block size to maintain random access to the marginally compressible data for the 4:4 packed compression state that includes four 32 byte blocks. Operating at the smaller block size avoids potential performance degradation in the form of overfetching during random accesses at 32 byte granularity for marginally compressible workloads. In an embodiment, the specialized compressor is included within the data compression unit 110 or in the ECC computation unit 115. As shown in FIG. 2A, the 4:4 packed compression state decreases the average packing failure rate to 10% or less. When all four packed compression states are available, as shown by the rightmost bar in each set, the lowest packing failure rate is achieved.

Figure 2B:
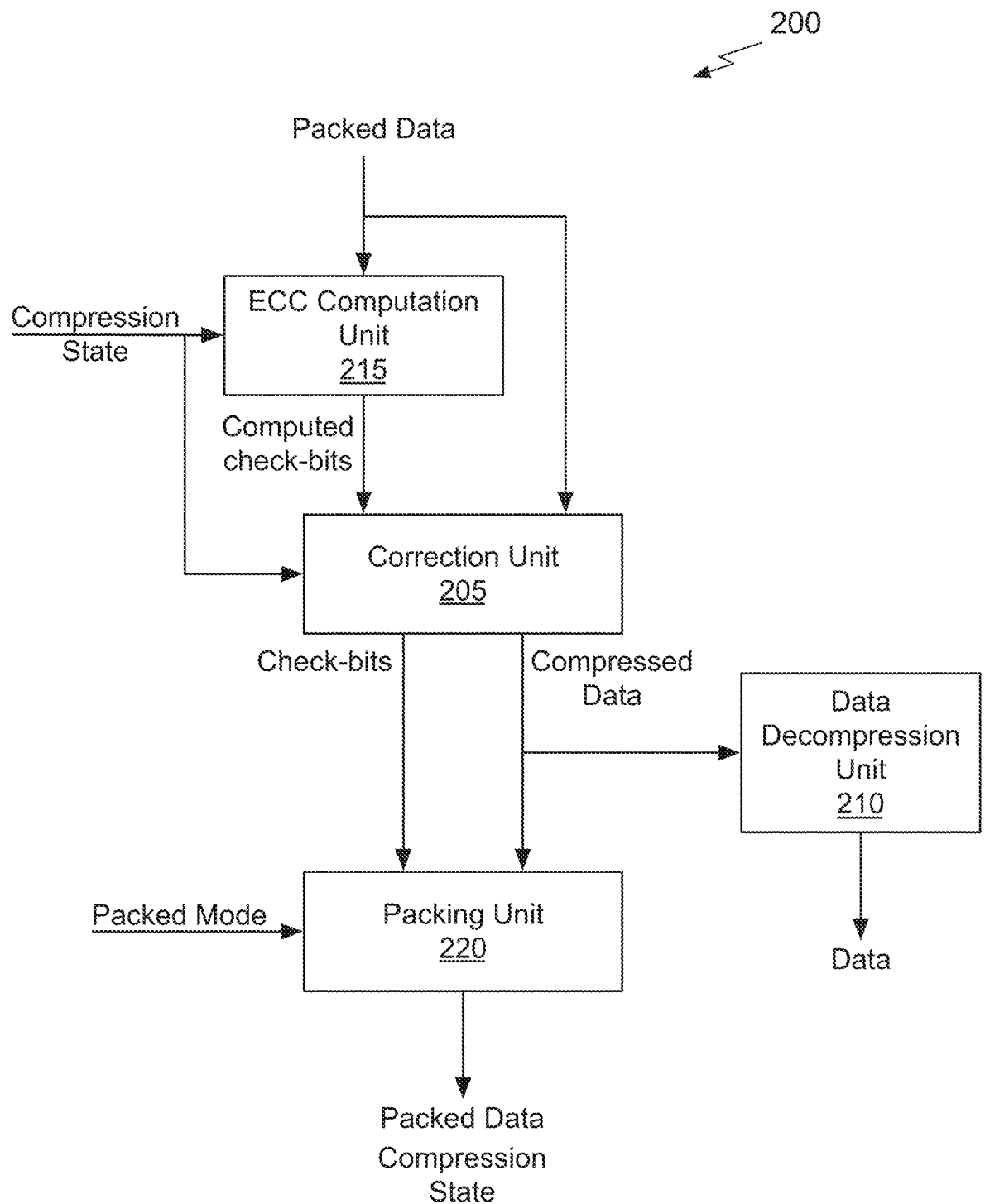
FIG. 2B illustrates a block diagram of example ECC and compressed data correction logic suitable for use in implementing some embodiments of the present disclosure.

FIG. 2B illustrates a block diagram of example ECC and compressed data correction logic 200 suitable for use in implementing some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory. Furthermore, persons of ordinary skill in the art will understand that any system that performs the operations of the ECC and compressed data correction logic 200 is within the scope and spirit of embodiments of the present disclosure.

As shown in FIG. 2B, an ECC computation unit 215 computes ECC check-bits for the compressed data portion of the packed data and a correction unit 205 compares the computed check-bits with the check-bits portion of the packed data to detect if the compressed data is correct or corrupted. The ECC computation unit 215 and the correction unit 205 each use the compression state for the packed data to separate the compressed data and check-bits, as needed. If the correction unit 205 determines that the compressed data is corrupted, then correction unit 205 corrects the compressed data. The correction unit 205 outputs the compressed data to a data decompression unit 210 and a packing unit 220. The correction unit 205 also outputs the check-bits portion of the packed data to the packing unit 220.

The packing unit 220 performs the same operations as the packing unit 120, outputting the combination and compression state. In an embodiment, the packed mode may change compared with the packed mode that was used by the packing unit 120. When the packed mode is unchanged and no corruption is detected by the correction unit 205, the packed data received by the ECC computation unit 215 may be selected for output by the ECC and compressed data correction logic 200. In an embodiment, the data decompression unit 210 is at a destination point and the packed data is not transferred within the processor or to an additional device that is external and the packing unit 220 is omitted.

The compression operation performed by the data decompression unit 210 is decoupled from the ECC check-bit computation, correction, and packing operations. The data decompression unit 210 may be in a separate processing unit with one or more storage and/or transmission circuits between the data compression unit 210 and the correction unit 205. However, to best protect the compressed data, the detection and, if needed, correction of the compressed data should be performed at the input to the data decompression unit 210 to ensure that the compressed data is not corrupted between the correction unit and the data decompression unit 210.

Figure 2C:
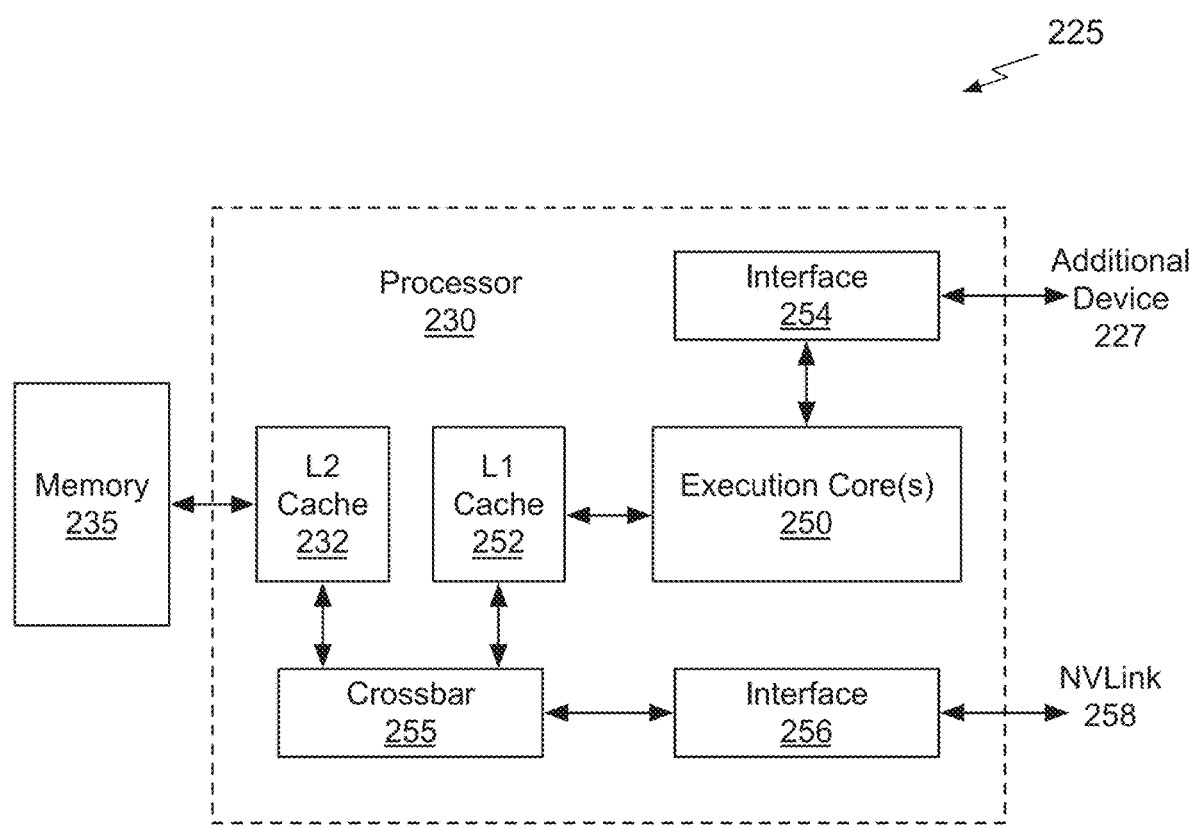
FIG. 2C illustrates a block diagram of an example system for use in implementing some embodiments of the present disclosure.

FIG. 2C illustrates a block diagram of an example system 225 for use in implementing some embodiments of the present disclosure. The system 225 includes a processor 230 and memory 235 that is external to the processor 230 and may comprise multiple memory devices. The processor 230 includes an interface 254 with at least one additional device 227 that is external to the processor 230 and an interface 256 with an NVLink 258 interconnect.

In addition to units, such as the interfaces 254 and 256, the processor 230 also includes one or more units comprising storage, such as an L2 cache 232 and L1 cache 252, a crossbar 255 interconnect, and/or processing or execution cores 250. Each one of the units may include an ECC packing unit 120 and/or may be capable of compressing data and computing ECC check-bits. Each one of the units may include an ECC packing unit 220 and/or may be capable of detecting and correcting errors in compressed data based on the check-bits. Each one of the units may also be configured to decompress the compressed data. In general, for a particular transaction, any one of the units may be a source point that generates the packed data, an intermediate point that simply transmits the packed data with or without detecting and correcting errors, or a destination point that detects and corrects errors in the compressed data that is included with the check-bits in the packed data. The destination point may also decompress the compressed data. Similarly, the source point may also compress the data that is packed with the check-bits. The packed data may be stored into memory 235 with or without detecting and correcting errors. For some transactions, the source or destination is external to the processor 230 and reached via NVLink 258. The source point and destination point define a zone of protection for compressed data. Intermediate points that detect and correct errors may be used to enhance reliability.

Packed ECC enables opportunistic end-to-end protection within the zone of protection. For example, the L2 cache 232 may store packed data and may optionally detect and correct errors. The crossbar 255 may transfer packed data between one or more of the L2 cache 232, L1 cache 252, and interface 256. The L2 cache 252 may store packed data and optionally detect and correct errors while also decompressing the compressed data for output to the execution core(s) 250. The L2 cache 252 may also compress and pack data received from the execution core(s) 250. Providing error detection and correction in the L2 cache 232 and L1 cache 252 filling a potential reliability coverage hole within the processor 230 and increasing a range of the zone of protection across the crossbar 255.

Storing packed data in the memory 235 and detecting and correcting errors in the L2 cache 252 provides protection for data transferred between the memory 235 and the processor 230. Detecting and correcting errors at the interface 254 provides protection for data transferred between the processor 230 and the additional device 227. Similarly, detecting and correcting errors at the interface 256 provides protection for data transferred between the processor 230 and the devices coupled to the NVlink 258.

Figure 2D:
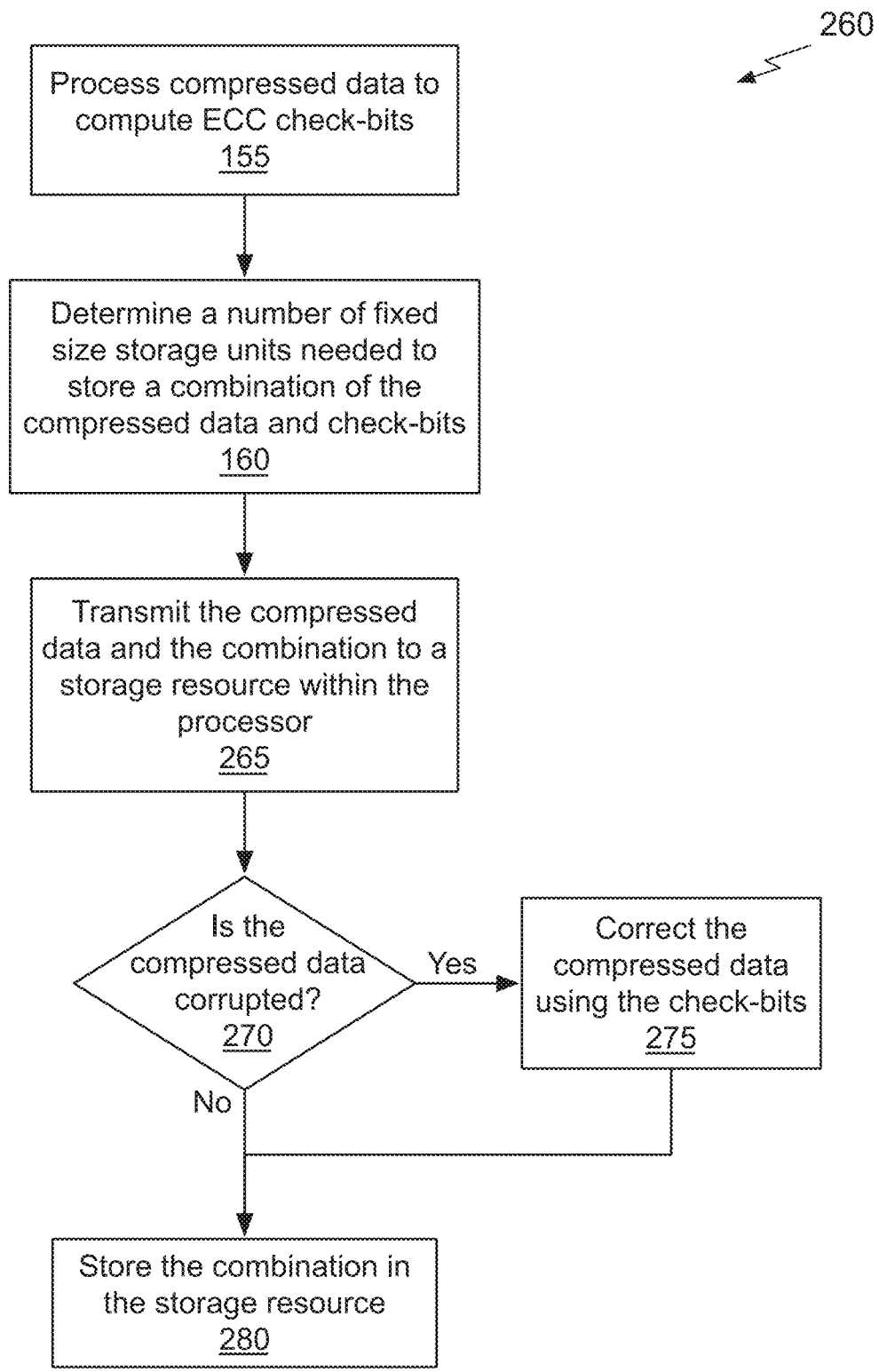
FIG. 2D illustrates another flowchart of a method for packing ECC check-bits for compressed data protection suitable for use in implementing some embodiments of the present disclosure.

FIG. 2D illustrates another flowchart of a method 260 for packing ECC check-bits for compressed data protection suitable for use in implementing some embodiments of the present disclosure. Each block of method 260, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 260 is described, by way of example, with respect to the logic of FIGS. 1A, 2B, and 2C. However, this method may additionally or alternatively be executed by any one system, or any combination of systems, including, but not limited to, those described herein. Furthermore, persons of ordinary skill in the art will understand that any system that performs method 260 is within the scope and spirit of embodiments of the present disclosure.

Steps 155 and 160, are performed as previously described in conjunction with the method 150. At step 265, the combination of the compressed data and check-bits are transmitted to a storage resource within the processor. In an embodiment, a storage resource within the processor includes a register file and/or memory, such as the L2 cache 232 and L1 cache 252 within the processor 230. In an embodiment, the combination is transmitted through a crossbar interconnect within the processor to the storage resource. In an embodiment, the storage resource is a source, intermediate, and/or a destination point within the processor.

At step 270, logic at the intermediate or destination point to which the combination is transmitted determines if the compressed data is corrupted. In an embodiment, the logic includes the ECC computation unit 215 and correction unit 205. If, at step 270, the compressed data is corrupted, then at step 275 the compressed data is corrected using the check-bits before proceeding to step 280. At step 280, the combination is stored in the storage resource. In another embodiment, only the compressed data is stored at step 280 and the check-bits are discarded. In an embodiment, step 280 is performed before step 270 and any corrupted compressed data stored in the storage resource is overwritten after being corrected. In another embodiment, step 280 is performed before step 270 and any corrupted compressed data stored in the storage resource is corrected when the compressed is read from the storage resource. In an embodiment, an execution core within the processor received the combination from the storage resource, the execution core determines that the compressed data is corrupted based on the check-bits, and the execution core corrects the compressed data using the check-bits before processing the compressed data.

In an embodiment, the combination is read from the storage resource and transmitted from the processor to an additional device that is external to the processor. In an embodiment, the additional device determines that the compressed data is corrupted and corrects the compressed data using the check-bits before processing and/or storing the combination. In an embodiment, the check-bits are discarded at an interface with the additional device and only the compressed data is transmitted from the processor to the additional device. In an embodiment, the combination is transmitted from the processor and stored in a memory device that is external to the processor. In an embodiment, the check-bits are discarded at an interface with the memory device and only the compressed data is transmitted from the processor to the memory device.

Compared with inline ECC implementations, packing the check-bits with the compressed data avoids or significantly reduces dedicated check-bit storage in external memory and dedicated write and read requests for the check-bits. Protection can be extended within a processor and between separate devices by transmitting the combination of compressed data and check-bits between different processing units, storage resources, and devices. Therefore, reliability holes may be filled—even for interconnect structures within the processor and between devices. For data that cannot be sufficiently compressed, inline ECC protection may be used while still benefitting from the efficiencies of packing other data that can be sufficiently compressed. Overall, packed ECC reduces memory bandwidth consumption and power while improving reliability and performance.

Parallel Processing Architecture

Figure 3:
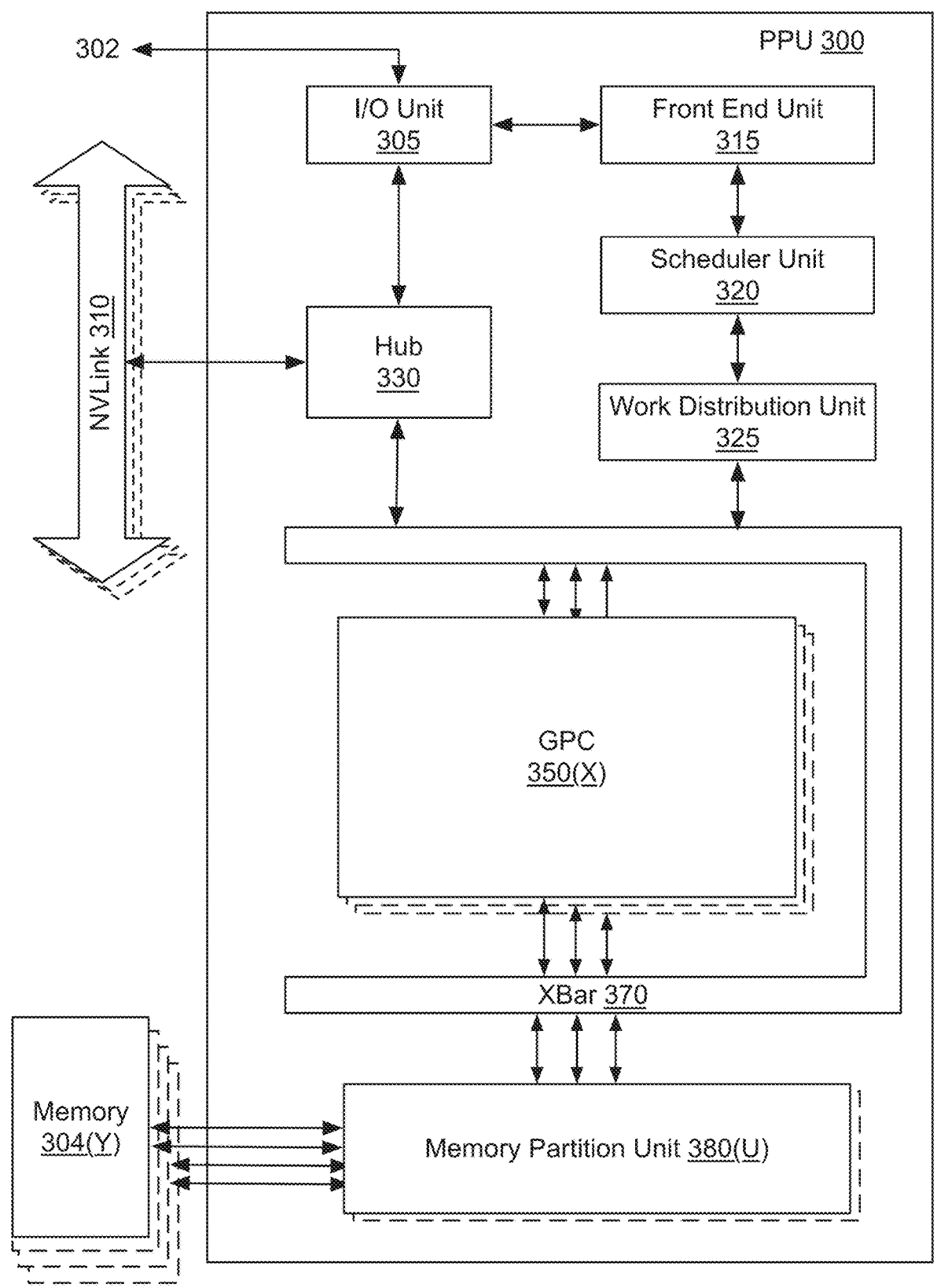
FIG. 3 illustrates an example parallel processing unit suitable for use in implementing some embodiments of the present disclosure.

FIG. 3 illustrates a parallel processing unit (PPU) 300, in accordance with an embodiment. The PPU 300 may be include one or more of the ECC and compressed data packing logic 100 or the ECC and compressed data correction logic 200. The PPU 300 may include one or more of the data compression unit 110, ECC computation units 115 and 215, packing units 120 and 220, correction unit 205, or data decompression unit 210. The PPU 300 may be configured to implement the method 150 or 260 shown in FIGS. 1E and 2D, respectively.

In an embodiment, a processor such as the PPU 300 may be configured to implement a neural network model. The neural network model may be implemented as software instructions executed by the processor or, in other embodiments, the processor can include a matrix of hardware elements configured to process a set of inputs (e.g., electrical signals representing values) to generate a set of outputs, which can represent activations of the neural network model. In yet other embodiments, the neural network model can be implemented as a combination of software instructions and processing performed by a matrix of hardware elements. Implementing the neural network model can include determining a set of parameters for the neural network model through, e.g., supervised or unsupervised training of the neural network model as well as, or in the alternative, performing inference using the set of parameters to process novel sets of inputs.

In an embodiment, the PPU 300 is a multi-threaded processor that is implemented on one or more integrated circuit devices. The PPU 300 is a latency hiding architecture designed to process many threads in parallel. A thread (e.g., a thread of execution) is an instantiation of a set of instructions configured to be executed by the PPU 300. In an embodiment, the PPU 300 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the PPU 300 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more PPUs 300 may be configured to accelerate thousands of High Performance Computing (HPC), data center, cloud computing, and machine learning applications. The PPU 300 may be configured to accelerate numerous deep learning systems and applications for autonomous vehicles, simulation, computational graphics such as ray or path tracing, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 3, the PPU 300 includes an Input/Output (I/O) unit 305, a front end unit 315, a scheduler unit 320, a work distribution unit 325, a hub 330, a crossbar (Xbar) 370, one or more general processing clusters (GPCs) 350, and one or more memory partition units 380. The PPU 300 may be connected to a host processor or other PPUs 300 via one or more high-speed NVLink 310 interconnect. The PPU 300 may be connected to a host processor or other peripheral devices via an interconnect 302. The PPU 300 may also be connected to a local memory 304 comprising a number of memory devices. In an embodiment, the local memory may comprise a number of dynamic random access memory (DRAM) devices. The DRAM devices may be configured as a high-bandwidth memory (HBM) subsystem, with multiple DRAM dies stacked within each device.

The NVLink 310 interconnect enables systems to scale and include one or more PPUs 300 combined with one or more CPUs, supports cache coherence between the PPUs 300 and CPUs, and CPU mastering. Data and/or commands may be transmitted by the NVLink 310 through the hub 330 to/from other units of the PPU 300 such as one or more copy engines, a video encoder, a video decoder, a power management unit, etc. (not explicitly shown). The NVLink 310 is described in more detail in conjunction with FIG. 5A.

The I/O unit 305 is configured to transmit and receive communications (e.g., commands, data, etc.) from a host processor (not shown) over the interconnect 302. The I/O unit 305 may communicate with the host processor directly via the interconnect 302 or through one or more intermediate devices such as a memory bridge. In an embodiment, the I/O unit 305 may communicate with one or more other processors, such as one or more the PPUs 300 via the interconnect 302. In an embodiment, the I/O unit 305 implements a Peripheral Component Interconnect Express (PCIe) interface for communications over a PCIe bus and the interconnect 302 is a PCIe bus. In alternative embodiments, the I/O unit 305 may implement other types of well-known interfaces for communicating with external devices.

The I/O unit 305 decodes packets received via the interconnect 302. In an embodiment, the packets represent commands configured to cause the PPU 300 to perform various operations. The I/O unit 305 transmits the decoded commands to various other units of the PPU 300 as the commands may specify. For example, some commands may be transmitted to the front end unit 315. Other commands may be transmitted to the hub 330 or other units of the PPU 300 such as one or more copy engines, a video encoder, a video decoder, a power management unit, etc. (not explicitly shown). In other words, the I/O unit 305 is configured to route communications between and among the various logical units of the PPU 300.

In an embodiment, a program executed by the host processor encodes a command stream in a buffer that provides workloads to the PPU 300 for processing. A workload may comprise several instructions and data to be processed by those instructions. The buffer is a region in a memory that is accessible (e.g., read/write) by both the host processor and the PPU 300. For example, the I/O unit 305 may be configured to access the buffer in a system memory connected to the interconnect 302 via memory requests transmitted over the interconnect 302. In an embodiment, the host processor writes the command stream to the buffer and then transmits a pointer to the start of the command stream to the PPU 300. The front end unit 315 receives pointers to one or more command streams. The front end unit 315 manages the one or more streams, reading commands from the streams and forwarding commands to the various units of the PPU 300.

The front end unit 315 is coupled to a scheduler unit 320 that configures the various GPCs 350 to process tasks defined by the one or more streams. The scheduler unit 320 is configured to track state information related to the various tasks managed by the scheduler unit 320. The state may indicate which GPC 350 a task is assigned to, whether the task is active or inactive, a priority level associated with the task, and so forth. The scheduler unit 320 manages the execution of a plurality of tasks on the one or more GPCs 350.

The scheduler unit 320 is coupled to a work distribution unit 325 that is configured to dispatch tasks for execution on the GPCs 350. The work distribution unit 325 may track a number of scheduled tasks received from the scheduler unit 320. In an embodiment, the work distribution unit 325 manages a pending task pool and an active task pool for each of the GPCs 350. The pending task pool may comprise a number of slots (e.g., 32 slots) that contain tasks assigned to be processed by a particular GPC 350. The active task pool may comprise a number of slots (e.g., 4 slots) for tasks that are actively being processed by the GPCs 350. As a GPC 350 finishes the execution of a task, that task is evicted from the active task pool for the GPC 350 and one of the other tasks from the pending task pool is selected and scheduled for execution on the GPC 350. If an active task has been idle on the GPC 350, such as while waiting for a data dependency to be resolved, then the active task may be evicted from the GPC 350 and returned to the pending task pool while another task in the pending task pool is selected and scheduled for execution on the GPC 350.

The work distribution unit 325 communicates with the one or more GPCs 350 via XBar 370. The XBar 370 is an interconnect network that couples many of the units of the PPU 300 to other units of the PPU 300. For example, the XBar 370 may be configured to couple the work distribution unit 325 to a particular GPC 350. Although not shown explicitly, one or more other units of the PPU 300 may also be connected to the XBar 370 via the hub 330.

The tasks are managed by the scheduler unit 320 and dispatched to a GPC 350 by the work distribution unit 325. The GPC 350 is configured to process the task and generate results. The results may be consumed by other tasks within the GPC 350, routed to a different GPC 350 via the XBar 370, or stored in the memory 304. The results can be written to the memory 304 via the memory partition units 380, which implement a memory interface for reading and writing data to/from the memory 304. The results can be transmitted to another PPU 300 or CPU via the NVLink 310. In an embodiment, the PPU 300 includes a number U of memory partition units 380 that is equal to the number of separate and distinct memory devices of the memory 304 coupled to the PPU 300. A memory partition unit 380 will be described in more detail below in conjunction with FIG. 4B.

In an embodiment, a host processor executes a driver kernel that implements an application programming interface (API) that enables one or more applications executing on the host processor to schedule operations for execution on the PPU 300. In an embodiment, multiple compute applications are simultaneously executed by the PPU 300 and the PPU 300 provides isolation, quality of service (QoS), and independent address spaces for the multiple compute applications. An application may generate instructions (e.g., API calls) that cause the driver kernel to generate one or more tasks for execution by the PPU 300. The driver kernel outputs tasks to one or more streams being processed by the PPU 300. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 4C.

Figure 4A:
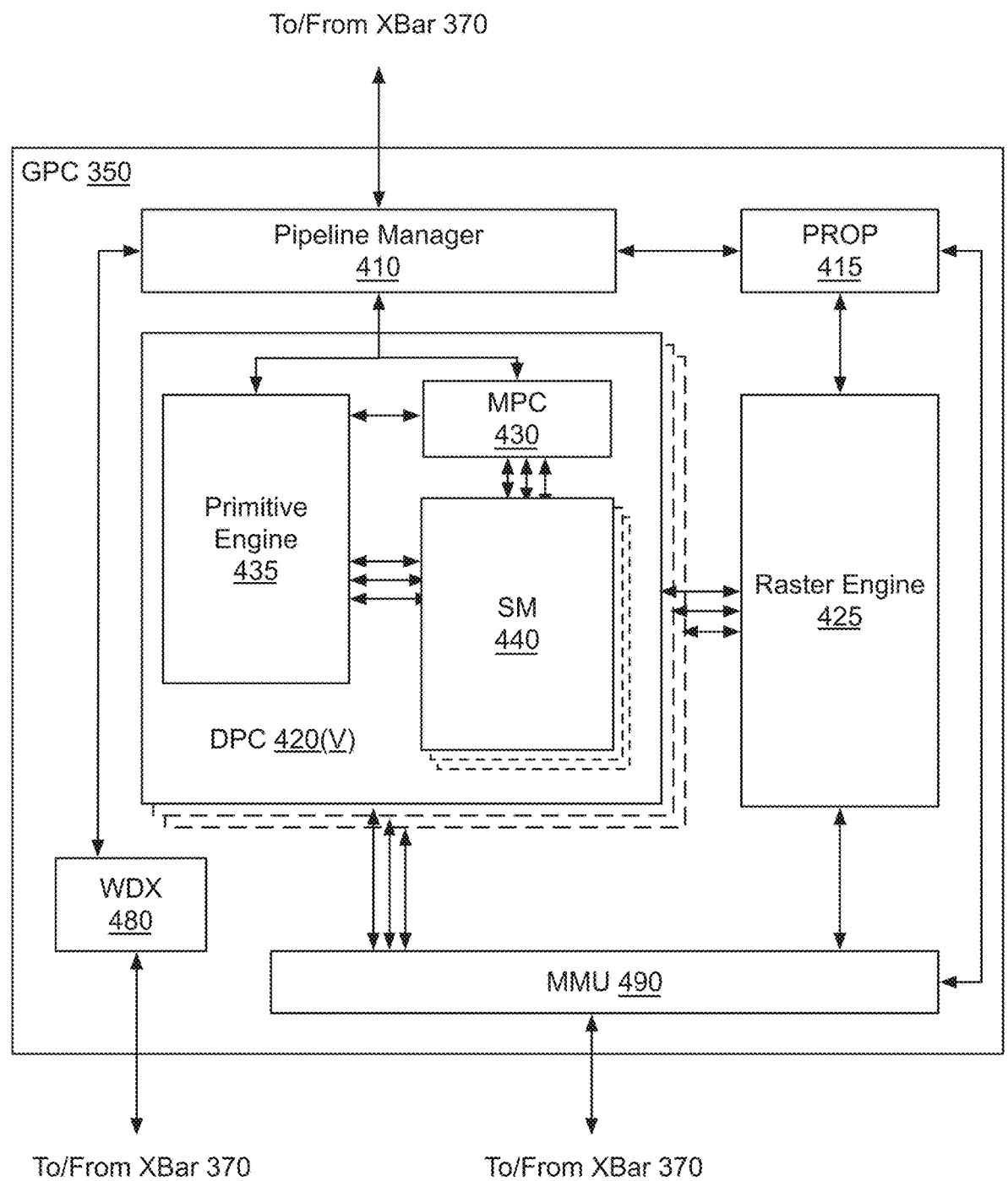
FIG. 4A illustrates an example general processing cluster within the parallel processing unit of FIG. 3, suitable for use in implementing some embodiments of the present disclosure.

FIG. 4A illustrates a GPC 350 of the PPU 300 of FIG. 3, in accordance with an embodiment. As shown in FIG. 4A, each GPC 350 includes a number of hardware units for processing tasks. In an embodiment, each GPC 350 includes a pipeline manager 410, a pre-raster operations unit (PROP) 415, a raster engine 425, a work distribution crossbar (WDX) 480, a memory management unit (MMU) 490, and one or more Data Processing Clusters (DPCs) 420. It will be appreciated that the GPC 350 of FIG. 4A may include other hardware units in lieu of or in addition to the units shown in FIG. 4A.

In an embodiment, the operation of the GPC 350 is controlled by the pipeline manager 410. The pipeline manager 410 manages the configuration of the one or more DPCs 420 for processing tasks allocated to the GPC 350. In an embodiment, the pipeline manager 410 may configure at least one of the one or more DPCs 420 to implement at least a portion of a graphics rendering pipeline. For example, a DPC 420 may be configured to execute a vertex shader program on the programmable streaming multiprocessor (SM) 440. The pipeline manager 410 may also be configured to route packets received from the work distribution unit 325 to the appropriate logical units within the GPC 350. For example, some packets may be routed to fixed function hardware units in the PROP 415 and/or raster engine 425 while other packets may be routed to the DPCs 420 for processing by the primitive engine 435 or the SM 440. In an embodiment, the pipeline manager 410 may configure at least one of the one or more DPCs 420 to implement a neural network model and/or a computing pipeline.

Figure 4B:
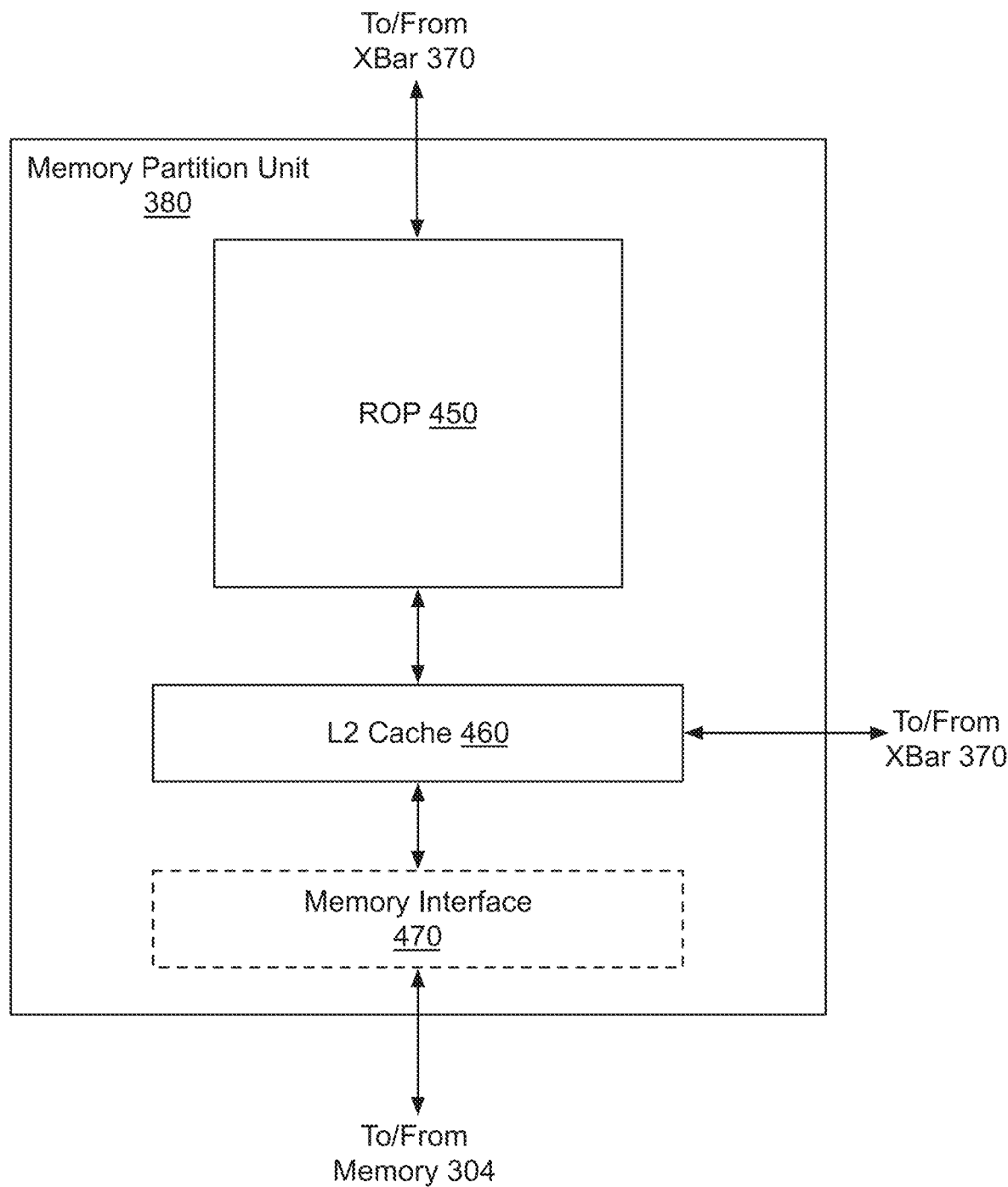
FIG. 4B illustrates an example memory partition unit of the parallel processing unit of FIG. 3, suitable for use in implementing some embodiments of the present disclosure.

The PROP unit 415 is configured to route data generated by the raster engine 425 and the DPCs 420 to a Raster Operations (ROP) unit, described in more detail in conjunction with FIG. 4B. The PROP unit 415 may also be configured to perform optimizations for color blending, organize pixel data, perform address translations, and the like.

The raster engine 425 includes a number of fixed function hardware units configured to perform various raster operations. In an embodiment, the raster engine 425 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x,y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 425 comprises fragments to be processed, for example, by a fragment shader implemented within a DPC 420.

Each DPC 420 included in the GPC 350 includes an M-Pipe Controller (MPC) 430, a primitive engine 435, and one or more SMs 440. The MPC 430 controls the operation of the DPC 420, routing packets received from the pipeline manager 410 to the appropriate units in the DPC 420. For example, packets associated with a vertex may be routed to the primitive engine 435, which is configured to fetch vertex attributes associated with the vertex from the memory 304. In contrast, packets associated with a shader program may be transmitted to the SM 440.

The SM 440 comprises a programmable streaming processor that is configured to process tasks represented by a number of threads. Each SM 440 is multi-threaded and configured to execute a plurality of threads (e.g., 32 threads) from a particular group of threads concurrently. In an embodiment, the SM 440 implements a SIMD (Single-Instruction, Multiple-Data) architecture where each thread in a group of threads (e.g., a warp) is configured to process a different set of data based on the same set of instructions. All threads in the group of threads execute the same instructions. In another embodiment, the SM 440 implements a SIMT (Single-Instruction, Multiple Thread) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The SM 440 will be described in more detail below in conjunction with FIG. 4C.

The MMU 490 provides an interface between the GPC 350 and the memory partition unit 380. The MMU 490 may provide translation of virtual addresses into physical addresses, memory protection, and arbitration of memory requests. In an embodiment, the MMU 490 provides one or more translation lookaside buffers (TLBs) for performing translation of virtual addresses into physical addresses in the memory 304.

FIG. 4B illustrates a memory partition unit 380 of the PPU 300 of FIG. 3, in accordance with an embodiment. As shown in FIG. 4B, the memory partition unit 380 includes a Raster Operations (ROP) unit 450, a level two (L2) cache 460, and a memory interface 470. The memory interface 470 is coupled to the memory 304. Memory interface 470 may implement 32, 64, 128, 1024-bit data buses, or the like, for high-speed data transfer. In an embodiment, the PPU 300 incorporates U memory interfaces 470, one memory interface 470 per pair of memory partition units 380, where each pair of memory partition units 380 is connected to a corresponding memory device of the memory 304. For example, PPU 300 may be connected to up to Y memory devices, such as high bandwidth memory stacks or graphics double-data-rate, version 5, synchronous dynamic random access memory, or other types of persistent storage.

In an embodiment, the memory interface 470 implements an HBM2 memory interface and Y equals half U. In an embodiment, the HBM2 memory stacks are located on the same physical package as the PPU 300, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 304 supports Single-Error Correcting Double-Error Detecting (SECDED) ECC to protect data. ECC provides higher reliability for compute applications that are sensitive to data corruption. Reliability is especially important in large-scale cluster computing environments where PPUs 300 process very large datasets and/or run applications for extended periods.

In an embodiment, the PPU 300 implements a multi-level memory hierarchy. In an embodiment, the memory partition unit 380 supports a unified memory to provide a single unified virtual address space for CPU and PPU 300 memory, enabling data sharing between virtual memory systems. In an embodiment the frequency of accesses by a PPU 300 to memory located on other processors is traced to ensure that memory pages are moved to the physical memory of the PPU 300 that is accessing the pages more frequently. In an embodiment, the NVLink 310 supports address translation services allowing the PPU 300 to directly access a CPU's page tables and providing full access to CPU memory by the PPU 300.

In an embodiment, copy engines transfer data between multiple PPUs 300 or between PPUs 300 and CPUs. The copy engines can generate page faults for addresses that are not mapped into the page tables. The memory partition unit 380 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 304 or other system memory may be fetched by the memory partition unit 380 and stored in the L2 cache 460, which is located on-chip and is shared between the various GPCs 350. As shown, each memory partition unit 380 includes a portion of the L2 cache 460 associated with a corresponding memory 304. Lower level caches may then be implemented in various units within the GPCs 350. For example, each of the SMs 440 may implement a level one (L1) cache. The L1 cache is private memory that is dedicated to a particular SM 440. Data from the L2 cache 460 may be fetched and stored in each of the L1 caches for processing in the functional units of the SMs 440. The L2 cache 460 is coupled to the memory interface 470 and the XBar 370.

The ROP unit 450 performs graphics raster operations related to pixel color, such as color compression, pixel blending, and the like. The ROP unit 450 also implements depth testing in conjunction with the raster engine 425, receiving a depth for a sample location associated with a pixel fragment from the culling engine of the raster engine 425. The depth is tested against a corresponding depth in a depth buffer for a sample location associated with the fragment. If the fragment passes the depth test for the sample location, then the ROP unit 450 updates the depth buffer and transmits a result of the depth test to the raster engine 425. It will be appreciated that the number of memory partition units 380 may be different than the number of GPCs 350 and, therefore, each ROP unit 450 may be coupled to each of the GPCs 350. The ROP unit 450 tracks packets received from the different GPCs 350 and determines which GPC 350 that a result generated by the ROP unit 450 is routed to through the Xbar 370. Although the ROP unit 450 is included within the memory partition unit 380 in FIG. 4B, in other embodiment, the ROP unit 450 may be outside of the memory partition unit 380. For example, the ROP unit 450 may reside in the GPC 350 or another unit.

Figure 4C:
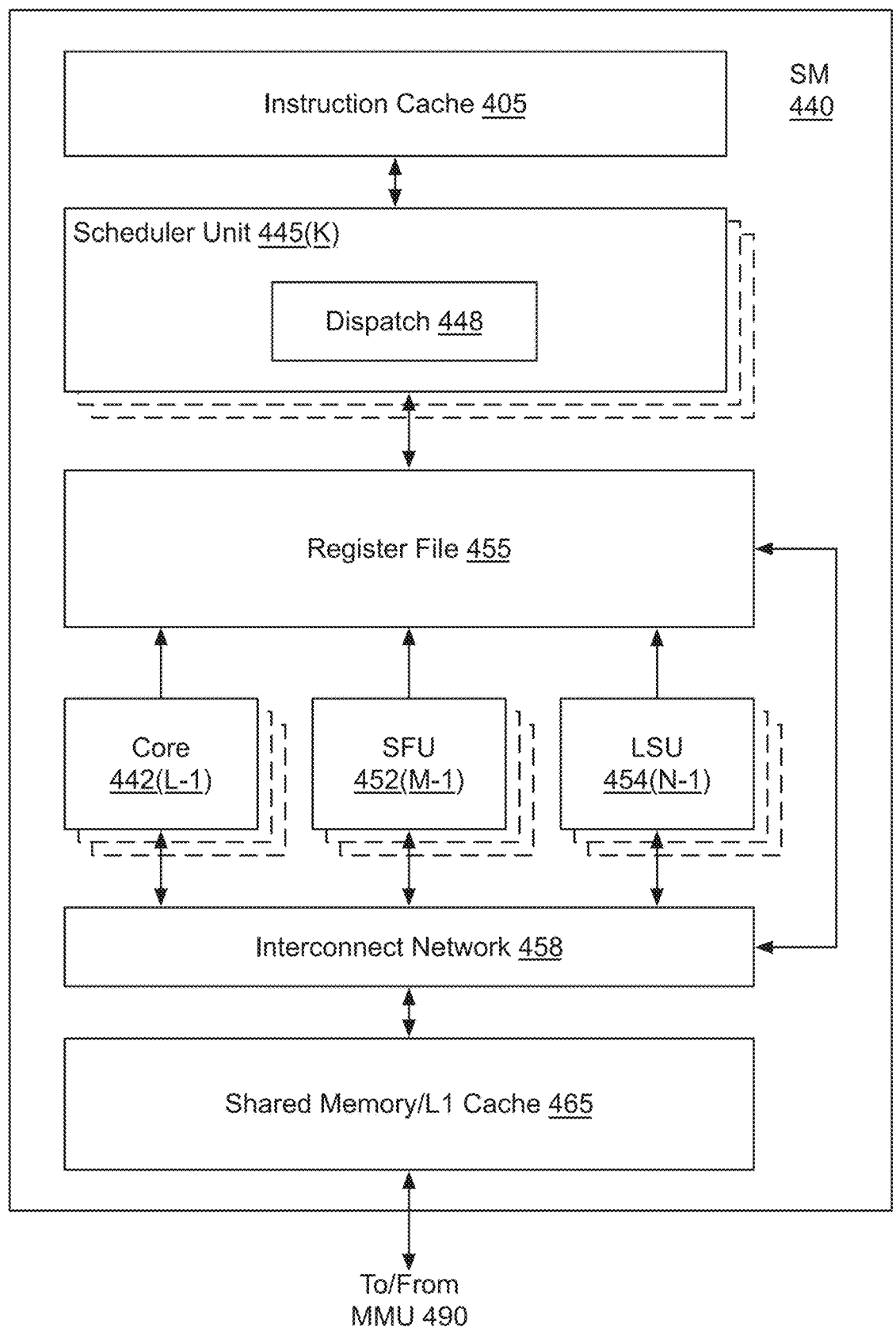
FIG. 4C illustrates an example of the streaming multiprocessor of FIG. 4A, suitable for use in implementing some embodiments of the present disclosure.

FIG. 4C illustrates the streaming multi-processor 440 of FIG. 4A, in accordance with an embodiment. As shown in FIG. 4C, the SM 440 includes an instruction cache 405, one or more (K) scheduler units 445, a register file 455, one or more processing cores 442, one or more special function units (SFUs) 452, one or more load/store units (LSUs) 454, an interconnect network 458, a shared memory/L1 cache 465.

As described above, the work distribution unit 325 dispatches tasks for execution on the GPCs 350 of the PPU 300. The tasks are allocated to a particular DPC 420 within a GPC 350 and, if the task is associated with a shader program, the task may be allocated to an SM 440. The scheduler unit 445 receives the tasks from the work distribution unit 325 and manages instruction scheduling for one or more thread blocks assigned to the SM 440. The scheduler unit 445 schedules thread blocks for execution as warps of parallel threads, where each thread block is allocated at least one warp. In an embodiment, each warp executes 32 threads. The scheduler unit 445 may manage a plurality of different thread blocks, allocating the warps to the different thread blocks and then dispatching instructions from the plurality of different cooperative groups to the various functional units (e.g., cores 442, SFUs 452, and LSUs 454) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch unit 448 is configured to transmit instructions to one or more of the functional units. In the embodiment, the scheduler unit 445 includes two dispatch units 448 that enable two different instructions from the same warp to be dispatched during each clock cycle. In alternative embodiments, each scheduler unit 445 may include a single dispatch unit 448 or additional dispatch units 448.

Each SM 440 includes a register file 455 that provides a set of registers for the functional units of the SM 440. In an embodiment, the register file 455 is divided between each of the functional units such that each functional unit is allocated a dedicated portion of the register file 455. In another embodiment, the register file 455 is divided between the different warps being executed by the SM 440. The register file 455 provides temporary storage for operands connected to the data paths of the functional units.

Each SM 440 comprises L processing cores 442. In an embodiment, the SM 440 includes a large number (e.g., 128, etc.) of distinct processing cores 442. Each core 442 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the cores 442 include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the cores 442. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A×B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 440 also comprises M SFUs 452 that perform special functions (e.g., attribute evaluation, reciprocal square root, and the like). In an embodiment, the SFUs 452 may include a tree traversal unit configured to traverse a hierarchical tree data structure. In an embodiment, the SFUs 452 may include texture unit configured to perform texture map filtering operations. In an embodiment, the texture units are configured to load texture maps (e.g., a 2D array of texels) from the memory 304 and sample the texture maps to produce sampled texture values for use in shader programs executed by the SM 440. In an embodiment, the texture maps are stored in the shared memory/L1 cache 465. The texture units implement texture operations such as filtering operations using mip-maps (e.g., texture maps of varying levels of detail). In an embodiment, each SM 340 includes two texture units.

Each SM 440 also comprises N LSUs 454 that implement load and store operations between the shared memory/L1 cache 465 and the register file 455. Each SM 440 includes an interconnect network 458 that connects each of the functional units to the register file 455 and the shared memory/L1 cache 465. In an embodiment, the interconnect network 458 is a crossbar that can be configured to connect any of the functional units to any of the registers in the register file 455 and memory locations in shared memory/L1 cache 465.

The shared memory/L1 cache 465 is an array of on-chip memory that allows for data storage and communication between the SM 440 and the primitive engine 435 and between threads in the SM 440. In an embodiment, the shared memory/L1 cache 465 comprises 128 KB of storage capacity and is in the path from the SM 440 to the memory partition unit 380. The shared memory/L1 cache 465 can be used to cache reads and writes. One or more of the shared memory/L1 cache 465, L2 cache 460, and memory 304 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 465 enables the shared memory/L1 cache 465 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 3, are bypassed, creating a much simpler programming model. In the general purpose parallel computation configuration, the work distribution unit 325 assigns and distributes blocks of threads directly to the DPCs 420. The threads in a block execute the same program, using a unique thread ID in the calculation to ensure each thread generates unique results, using the SM 440 to execute the program and perform calculations, shared memory/L1 cache 465 to communicate between threads, and the LSU 454 to read and write global memory through the shared memory/L1 cache 465 and the memory partition unit 380. When configured for general purpose parallel computation, the SM 440 can also write commands that the scheduler unit 320 can use to launch new work on the DPCs 420.

The PPU 300 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like.

In an embodiment, the PPU 300 is embodied on a single semiconductor substrate. In another embodiment, the PPU 300 is included in a system-on-a-chip (SoC) along with one or more other devices such as additional PPUs 300, the memory 304, a reduced instruction set computer (RISC) CPU, a memory management unit (MMU), a digital-to-analog converter (DAC), and the like.

In an embodiment, the PPU 300 may be included on a graphics card that includes one or more memory devices. The graphics card may be configured to interface with a PCIe slot on a motherboard of a desktop computer. In yet another embodiment, the PPU 300 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 5A:
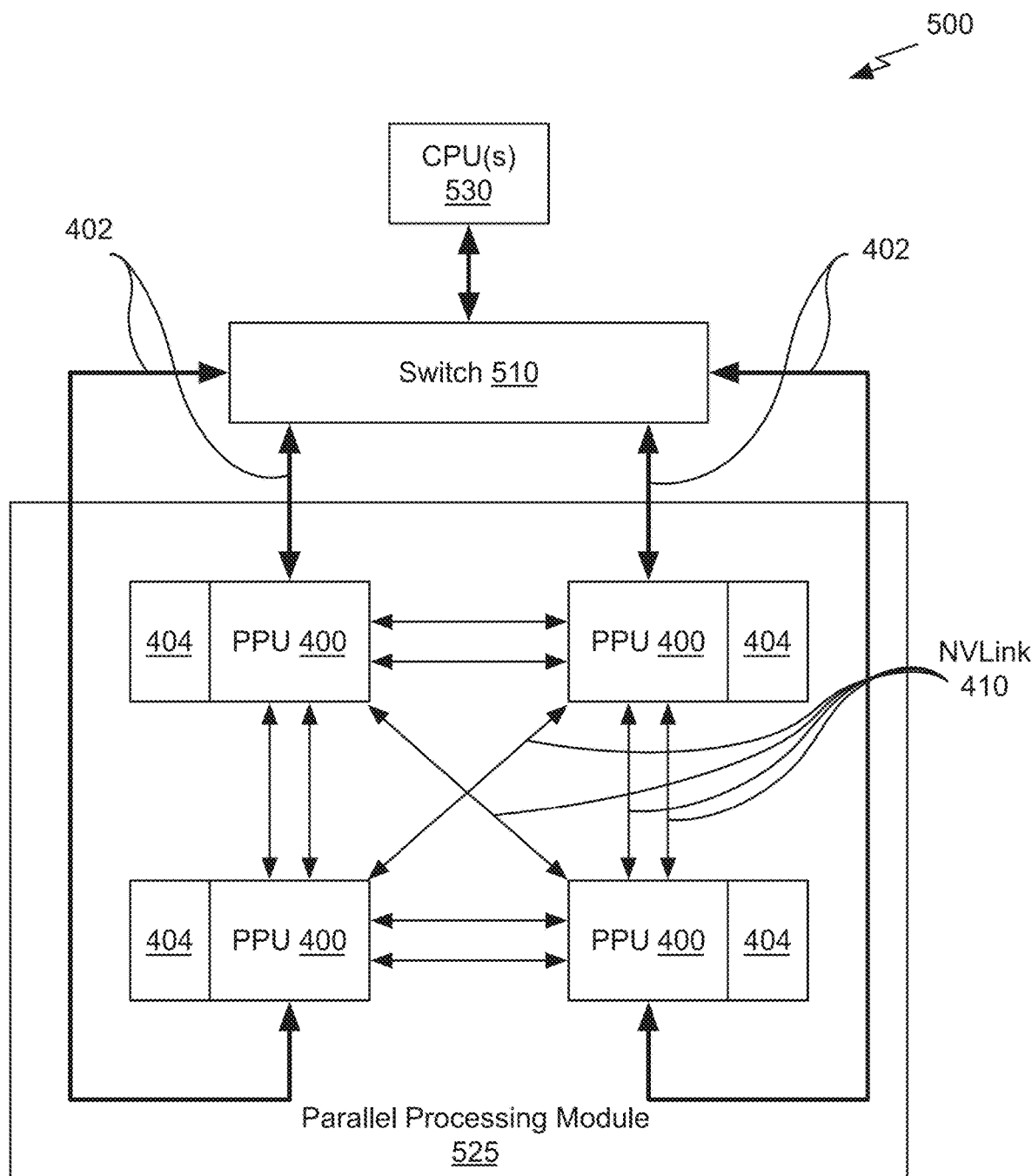
FIG. 5A is a conceptual diagram of a processing system implemented using the PPU of FIG. 4, suitable for use in implementing some embodiments of the present disclosure.

FIG. 5A is a conceptual diagram of a processing system 500 implemented using the PPU 300 of FIG. 3, in accordance with an embodiment. The exemplary system 565 may be configured to implement the method 150 or 260 shown in FIGS. 1E and 2D, respectively. The processing system 500 includes a CPU 530, switch 510, and multiple PPUs 300, and respective memories 304.

The PPUs 300 may each include, and/or be configured to perform functions of, one or more processing cores and/or components thereof, such as Tensor Cores (TCs), Tensor Processing Units (TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The NVLink 310 provides high-speed communication links between each of the PPUs 300. Although a particular number of NVLink 310 and interconnect 302 connections are illustrated in FIG. 5A, the number of connections to each PPU 300 and the CPU 530 may vary. The switch 510 interfaces between the interconnect 302 and the CPU 530. The PPUs 300, memories 304, and NVLinks 310 may be situated on a single semiconductor platform to form a parallel processing module 525. In an embodiment, the switch 510 supports two or more protocols to interface between various different connections and/or links.

In another embodiment (not shown), the NVLink 310 provides one or more high-speed communication links between each of the PPUs 300 and the CPU 530 and the switch 510 interfaces between the interconnect 302 and each of the PPUs 300. The PPUs 300, memories 304, and interconnect 302 may be situated on a single semiconductor platform to form a parallel processing module 525. In yet another embodiment (not shown), the interconnect 302 provides one or more communication links between each of the PPUs 300 and the CPU 530 and the switch 510 interfaces between each of the PPUs 300 using the NVLink 310 to provide one or more high-speed communication links between the PPUs 300. In another embodiment (not shown), the NVLink 310 provides one or more high-speed communication links between the PPUs 300 and the CPU 530 through the switch 510. In yet another embodiment (not shown), the interconnect 302 provides one or more communication links between each of the PPUs 300 directly. One or more of the NVLink 310 high-speed communication links may be implemented as a physical NVLink interconnect or either an on-chip or on-die interconnect using the same protocol as the NVLink 310.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 525 may be implemented as a circuit board substrate and each of the PPUs 300 and/or memories 304 may be packaged devices. In an embodiment, the CPU 530, switch 510, and the parallel processing module 525 are situated on a single semiconductor platform.

In an embodiment, the signaling rate of each NVLink 310 is 20 to 25 Gigabits/second and each PPU 300 includes six NVLink 310 interfaces (as shown in FIG. 5A, five NVLink 310 interfaces are included for each PPU 300). Each NVLink 310 provides a data transfer rate of 25 Gigabytes/second in each direction, with six links providing 300 Gigabytes/second. The NVLinks 310 can be used exclusively for PPU-to-PPU communication as shown in FIG. 5A, or some combination of PPU-to-PPU and PPU-to-CPU, when the CPU 530 also includes one or more NVLink 310 interfaces.

In an embodiment, the NVLink 310 allows direct load/store/atomic access from the CPU 530 to each PPU's 300 memory 304. In an embodiment, the NVLink 310 supports coherency operations, allowing data read from the memories 304 to be stored in the cache hierarchy of the CPU 530, reducing cache access latency for the CPU 530. In an embodiment, the NVLink 310 includes support for Address Translation Services (ATS), allowing the PPU 300 to directly access page tables within the CPU 530. One or more of the NVLinks 310 may also be configured to operate in a low-power mode.

Figure 5B:
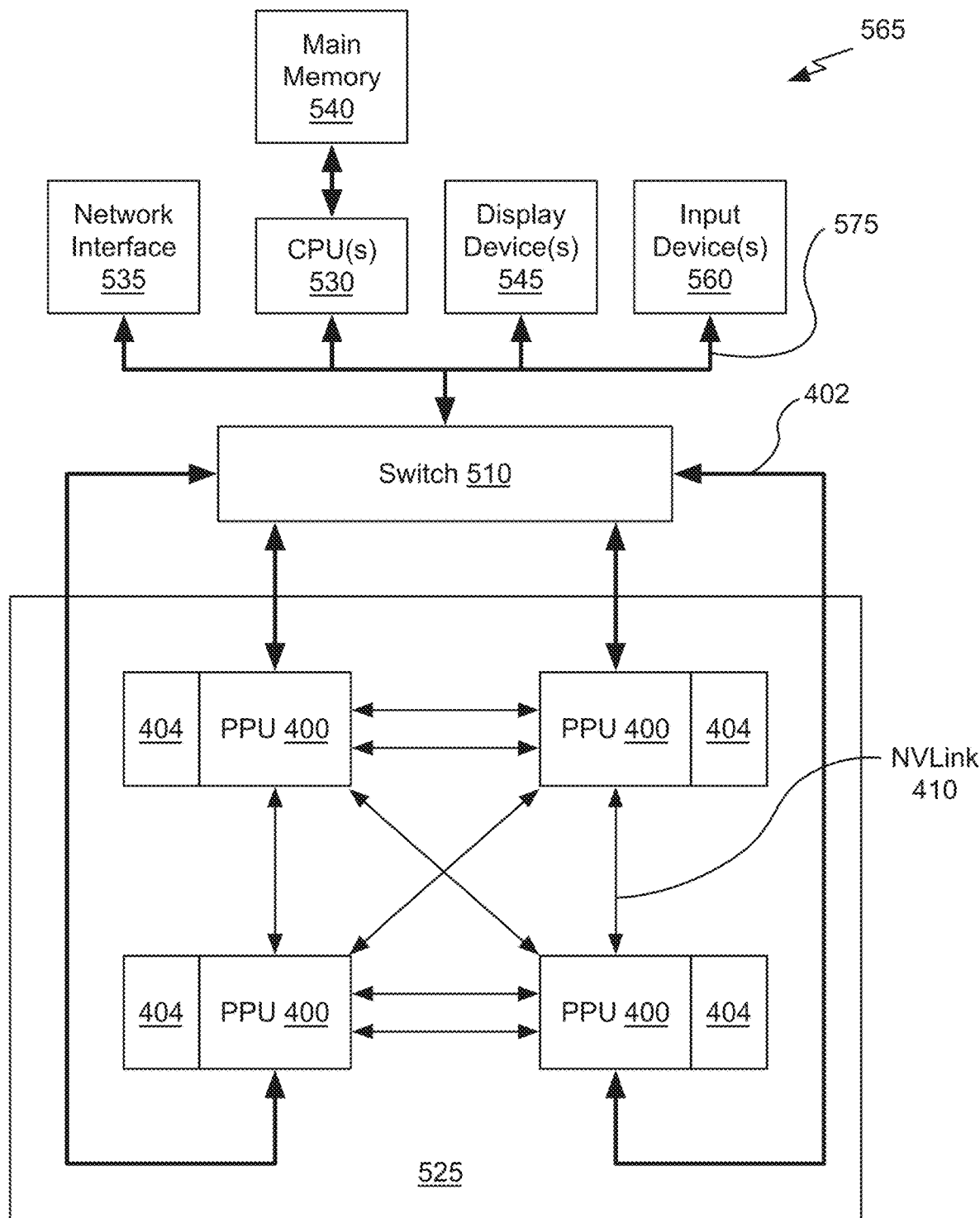
FIG. 5B illustrates an exemplary system in which the various architecture and/or functionality of the various previous embodiments may be implemented.

FIG. 5B illustrates an exemplary system 565 in which the various architecture and/or functionality of the various previous embodiments may be implemented. The exemplary system 565 may be configured to implement the method 150 or 260 shown in FIGS. 1E and 2D, respectively.

As shown, a system 565 is provided including at least one central processing unit 530 that is connected to a communication bus 575. The communication bus 575 may directly or indirectly couple one or more of the following devices: main memory 540, network interface 535, CPU(s) 530, display device(s) 545, input device(s) 560, switch 510, and parallel processing system 525. The communication bus 575 may be implemented using any suitable protocol and may represent one or more links or busses, such as an address bus, a data bus, a control bus, or a combination thereof. The communication bus 575 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, HyperTransport, and/or another type of bus or link. In some embodiments, there are direct connections between components. As an example, the CPU(s) 530 may be directly connected to the main memory 540. Further, the CPU(s) 530 may be directly connected to the parallel processing system 525. Where there is direct, or point-to-point connection between components, the communication bus 575 may include a PCIe link to carry out the connection. In these examples, a PCI bus need not be included in the system 565.

Although the various blocks of FIG. 5B are shown as connected via the communication bus 575 with lines, this is not intended to be limiting and is for clarity only. For example, in some embodiments, a presentation component, such as display device(s) 545, may be considered an I/O component, such as input device(s) 560 (e.g., if the display is a touch screen). As another example, the CPU(s) 530 and/or parallel processing system 525 may include memory (e.g., the main memory 540 may be representative of a storage device in addition to the parallel processing system 525, the CPUs 530, and/or other components). In other words, the computing device of FIG. 5B is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 5B.

The system 565 also includes a main memory 540. Control logic (software) and data are stored in the main memory 540 which may take the form of a variety of computer-readable media. The computer-readable media may be any available media that may be accessed by the system 565. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the main memory 540 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by system 565. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

Computer programs, when executed, enable the system 565 to perform various functions. The CPU(s) 530 may be configured to execute at least some of the computer-readable instructions to control one or more components of the system 565 to perform one or more of the methods and/or processes described herein. The CPU(s) 530 may each include one or more cores (e.g., one, two, four, eight, twenty-eight, seventy-two, etc.) that are capable of handling a multitude of software threads simultaneously. The CPU(s) 530 may include any type of processor, and may include different types of processors depending on the type of system 565 implemented (e.g., processors with fewer cores for mobile devices and processors with more cores for servers). For example, depending on the type of system 565, the processor may be an Advanced RISC Machines (ARM) processor implemented using Reduced Instruction Set Computing (RISC) or an x86 processor implemented using Complex Instruction Set Computing (CISC). The system 565 may include one or more CPUs 530 in addition to one or more microprocessors or supplementary co-processors, such as math co-processors.

In addition to or alternatively from the CPU(s) 530, the parallel processing module 525 may be configured to execute at least some of the computer-readable instructions to control one or more components of the system 565 to perform one or more of the methods and/or processes described herein. The parallel processing module 525 may be used by the system 565 to render graphics (e.g., 3D graphics) or perform general purpose computations. For example, the parallel processing module 525 may be used for General-Purpose computing on GPUs (GPGPU). In embodiments, the CPU(s) 530 and/or the parallel processing module 525 may discretely or jointly perform any combination of the methods, processes and/or portions thereof.

The system 565 also includes input device(s) 560, the parallel processing system 525, and display device(s) 545. The display device(s) 545 may include a display (e.g., a monitor, a touch screen, a television screen, a heads-up-display (HUD), other display types, or a combination thereof), speakers, and/or other presentation components. The display device(s) 545 may receive data from other components (e.g., the parallel processing system 525, the CPU(s) 530, etc.), and output the data (e.g., as an image, video, sound, etc.).

The network interface 535 may enable the system 565 to be logically coupled to other devices including the input devices 560, the display device(s) 545, and/or other components, some of which may be built in to (e.g., integrated in) the system 565. Illustrative input devices 560 include a microphone, mouse, keyboard, joystick, game pad, game controller, satellite dish, scanner, printer, wireless device, etc. The input devices 560 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the system 565. The system 565 may be include depth cameras, such as stereoscopic camera systems, infrared camera systems, RGB camera systems, touchscreen technology, and combinations of these, for gesture detection and recognition. Additionally, the system 565 may include accelerometers or gyroscopes (e.g., as part of an inertia measurement unit (IMU)) that enable detection of motion. In some examples, the output of the accelerometers or gyroscopes may be used by the system 565 to render immersive augmented reality or virtual reality.

Further, the system 565 may be coupled to a network (e.g., a telecommunications network, local area network (LAN), wireless network, wide area network (WAN) such as the Internet, peer-to-peer network, cable network, or the like) through a network interface 535 for communication purposes. The system 565 may be included within a distributed network and/or cloud computing environment.

The network interface 535 may include one or more receivers, transmitters, and/or transceivers that enable the system 565 to communicate with other computing devices via an electronic communication network, included wired and/or wireless communications. The network interface 535 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet.

The system 565 may also include a secondary storage (not shown). The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. The system 565 may also include a hard-wired power supply, a battery power supply, or a combination thereof (not shown). The power supply may provide power to the system 565 to enable the components of the system 565 to operate.

Each of the foregoing modules and/or devices may even be situated on a single semiconductor platform to form the system 565. Alternately, the various modules may also be situated separately or in various combinations of semiconductor platforms per the desires of the user. While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Example Network Environments

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the processing system 500 of FIG. 5A and/or exemplary system 565 of FIG. 5B—e.g., each device may include similar components, features, and/or functionality of the processing system 500 and/or exemplary system 565.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example processing system 500 of FIG. 5A and/or exemplary system 565 of FIG. 5B. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

Machine Learning

Deep neural networks (DNNs) developed on processors, such as the PPU 300 have been used for diverse use cases, from self-driving cars to faster drug development, from automatic image captioning in online image databases to smart real-time language translation in video chat applications. Deep learning is a technique that models the neural learning process of the human brain, continually learning, continually getting smarter, and delivering more accurate results more quickly over time. A child is initially taught by an adult to correctly identify and classify various shapes, eventually being able to identify shapes without any coaching. Similarly, a deep learning or neural learning system needs to be trained in object recognition and classification for it get smarter and more efficient at identifying basic objects, occluded objects, etc., while also assigning context to objects.

At the simplest level, neurons in the human brain look at various inputs that are received, importance levels are assigned to each of these inputs, and output is passed on to other neurons to act upon. An artificial neuron or perceptron is the most basic model of a neural network. In one example, a perceptron may receive one or more inputs that represent various features of an object that the perceptron is being trained to recognize and classify, and each of these features is assigned a certain weight based on the importance of that feature in defining the shape of an object.

A deep neural network (DNN) model includes multiple layers of many connected nodes (e.g., perceptrons, Boltzmann machines, radial basis functions, convolutional layers, etc.) that can be trained with enormous amounts of input data to quickly solve complex problems with high accuracy. In one example, a first layer of the DNN model breaks down an input image of an automobile into various sections and looks for basic patterns such as lines and angles. The second layer assembles the lines to look for higher level patterns such as wheels, windshields, and mirrors. The next layer identifies the type of vehicle, and the final few layers generate a label for the input image, identifying the model of a specific automobile brand.

Once the DNN is trained, the DNN can be deployed and used to identify and classify objects or patterns in a process known as inference. Examples of inference (the process through which a DNN extracts useful information from a given input) include identifying handwritten numbers on checks deposited into ATM machines, identifying images of friends in photos, delivering movie recommendations to over fifty million users, identifying and classifying different types of automobiles, pedestrians, and road hazards in driverless cars, or translating human speech in real-time.

During training, data flows through the DNN in a forward propagation phase until a prediction is produced that indicates a label corresponding to the input. If the neural network does not correctly label the input, then errors between the correct label and the predicted label are analyzed, and the weights are adjusted for each feature during a backward propagation phase until the DNN correctly labels the input and other inputs in a training dataset. Training complex neural networks requires massive amounts of parallel computing performance, including floating-point multiplications and additions that are supported by the PPU 300. Inferencing is less compute-intensive than training, being a latency-sensitive process where a trained neural network is applied to new inputs it has not seen before to classify images, detect emotions, identify recommendations, recognize and translate speech, and generally infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 300 is a computing platform capable of delivering performance required for deep neural network-based artificial intelligence and machine learning applications.

Furthermore, images generated applying one or more of the techniques disclosed herein may be used to train, test, or certify DNNs used to recognize objects and environments in the real world. Such images may include scenes of roadways, factories, buildings, urban settings, rural settings, humans, animals, and any other physical object or real-world setting. Such images may be used to train, test, or certify DNNs that are employed in machines or robots to manipulate, handle, or modify physical objects in the real world. Furthermore, such images may be used to train, test, or certify DNNs that are employed in autonomous vehicles to navigate and move the vehicles through the real world. Additionally, images generated applying one or more of the techniques disclosed herein may be used to convey information to users of such machines, robots, and vehicles.

Figure 5C:
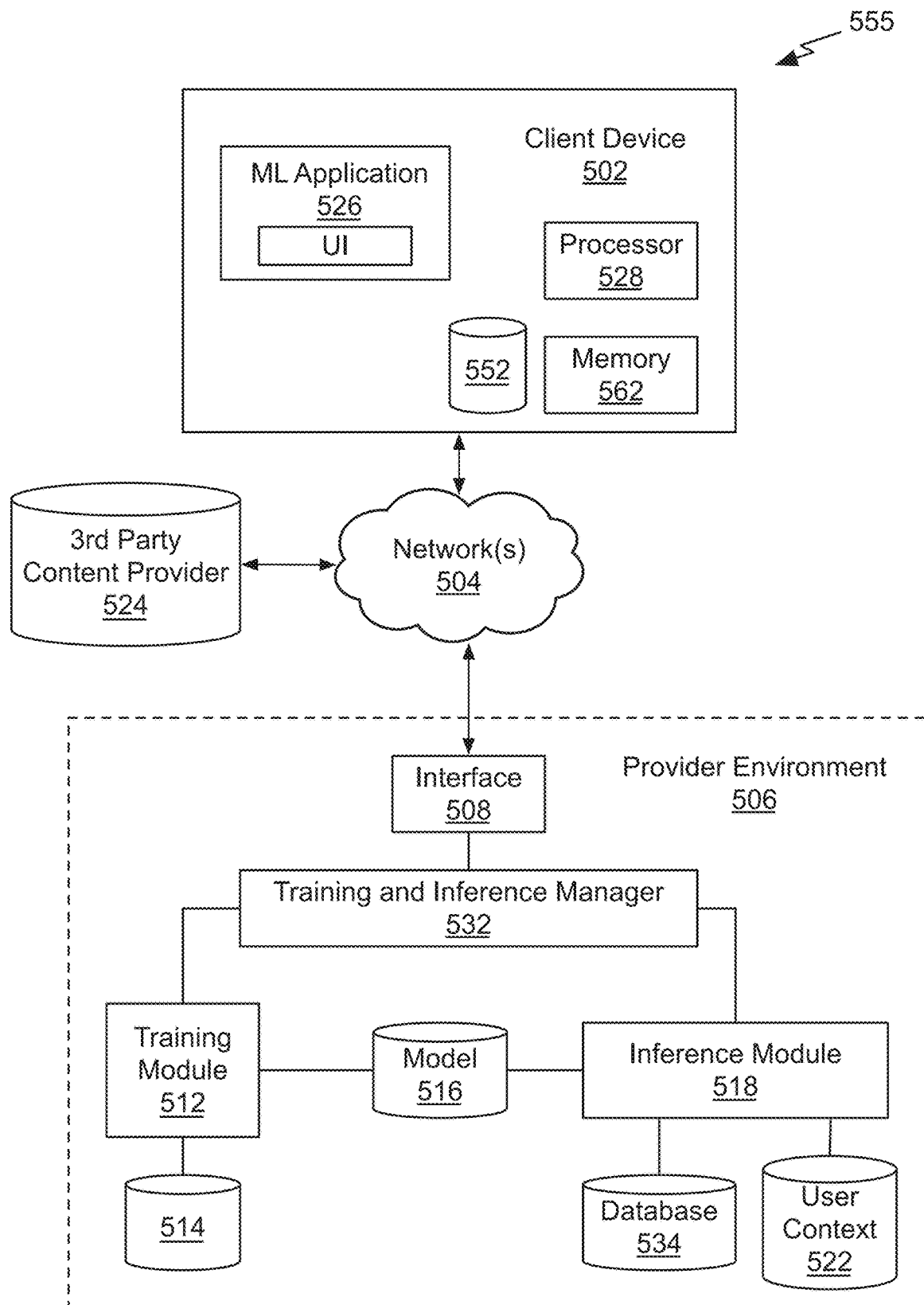
FIG. 5C illustrates components of an exemplary system that can be used to train and utilize machine learning, in at least one embodiment.

FIG. 5C illustrates components of an exemplary system 555 that can be used to train and utilize machine learning, in accordance with at least one embodiment. The exemplary system 555 may be include one or more of the ECC and compressed data packing logic 100 or the ECC and compressed data correction logic 200. The exemplary system 555 may include one or more of the data compression unit 110, ECC computation units 115 and 215, packing units 120 and 220, correction unit 205, or data decompression unit 210. The exemplary system 555 may be configured to implement the method 150 or 260 shown in FIGS. 1E and 2D, respectively.

As will be discussed, various components can be provided by various combinations of computing devices and resources, or a single computing system, which may be under control of a single entity or multiple entities. Further, aspects may be triggered, initiated, or requested by different entities. In at least one embodiment training of a neural network might be instructed by a provider associated with provider environment 506, while in at least one embodiment training might be requested by a customer or other user having access to a provider environment through a client device 502 or other such resource. In at least one embodiment, training data (or data to be analyzed by a trained neural network) can be provided by a provider, a user, or a third party content provider 524. In at least one embodiment, client device 502 may be a vehicle or object that is to be navigated on behalf of a user, for example, which can submit requests and/or receive instructions that assist in navigation of a device.

In at least one embodiment, requests are able to be submitted across at least one network 504 to be received by a provider environment 506. In at least one embodiment, a client device may be any appropriate electronic and/or computing devices enabling a user to generate and send such requests, such as, but not limited to, desktop computers, notebook computers, computer servers, smartphones, tablet computers, gaming consoles (portable or otherwise), computer processors, computing logic, and set-top boxes. Network(s) 504 can include any appropriate network for transmitting a request or other such data, as may include Internet, an intranet, an Ethernet, a cellular network, a local area network (LAN), a wide area network (WAN), a personal area network (PAN), an ad hoc network of direct wireless connections among peers, and so on.

In at least one embodiment, requests can be received at an interface layer 508, which can forward data to a training and inference manager 532, in this example. The training and inference manager 532 can be a system or service including hardware and software for managing requests and service corresponding data or content, in at least one embodiment, the training and inference manager 532 can receive a request to train a neural network and can provide data for a request to a training module 512. In at least one embodiment, training module 512 can select an appropriate model or neural network to be used, if not specified by the request, and can train a model using relevant training data. In at least one embodiment, training data can be a batch of data stored in a training data repository 514, received from client device 502, or obtained from a third party provider 524. In at least one embodiment, training module 512 can be responsible for training data. A neural network can be any appropriate network, such as a recurrent neural network (RNN) or convolutional neural network (CNN). Once a neural network is trained and successfully evaluated, a trained neural network can be stored in a model repository 516, for example, that may store different models or networks for users, applications, or services, etc. In at least one embodiment, there may be multiple models for a single application or entity, as may be utilized based on a number of different factors.

In at least one embodiment, at a subsequent point in time, a request may be received from client device 502 (or another such device) for content (e.g., path determinations) or data that is at least partially determined or impacted by a trained neural network. This request can include, for example, input data to be processed using a neural network to obtain one or more inferences or other output values, classifications, or predictions, or for at least one embodiment, input data can be received by interface layer 508 and directed to inference module 518, although a different system or service can be used as well. In at least one embodiment, inference module 518 can obtain an appropriate trained network, such as a trained deep neural network (DNN) as discussed herein, from model repository 516 if not already stored locally to inference module 518. Inference module 518 can provide data as input to a trained network, which can then generate one or more inferences as output. This may include, for example, a classification of an instance of input data. In at least one embodiment, inferences can then be transmitted to client device 502 for display or other communication to a user. In at least one embodiment, context data for a user may also be stored to a user context data repository 522, which may include data about a user which may be useful as input to a network in generating inferences, or determining data to return to a user after obtaining instances. In at least one embodiment, relevant data, which may include at least some of input or inference data, may also be stored to a local database 534 for processing future requests. In at least one embodiment, a user can use account information or other information to access resources or functionality of a provider environment. In at least one embodiment, if permitted and available, user data may also be collected and used to further train models, in order to provide more accurate inferences for future requests. In at least one embodiment, requests may be received through a user interface to a machine learning application 526 executing on client device 502, and results displayed through a same interface. A client device can include resources such as a processor 528 and memory 562 for generating a request and processing results or a response, as well as at least one data storage element 552 for storing data for machine learning application 526.

In at least one embodiment a processor 528 (or a processor of training module 512 or inference module 518) will be a central processing unit (CPU). As mentioned, however, resources in such environments can utilize GPUs to process data for at least certain types of requests. With thousands of cores, GPUs, such as PPU 300 are designed to handle substantial parallel workloads and, therefore, have become popular in deep learning for training neural networks and generating predictions. While use of GPUs for offline builds has enabled faster training of larger and more complex models, generating predictions offline implies that either request-time input features cannot be used or predictions must be generated for all permutations of features and stored in a lookup table to serve real-time requests. If a deep learning framework supports a CPU-mode and a model is small and simple enough to perform a feed-forward on a CPU with a reasonable latency, then a service on a CPU instance could host a model. In this case, training can be done offline on a GPU and inference done in real-time on a CPU. If a CPU approach is not viable, then a service can run on a GPU instance. Because GPUs have different performance and cost characteristics than CPUs, however, running a service that offloads a runtime algorithm to a GPU can require it to be designed differently from a CPU based service.

In at least one embodiment, video data can be provided from client device 502 for enhancement in provider environment 506. In at least one embodiment, video data can be processed for enhancement on client device 502. In at least one embodiment, video data may be streamed from a third party content provider 524 and enhanced by third party content provider 524, provider environment 506, or client device 502. In at least one embodiment, video data can be provided from client device 502 for use as training data in provider environment 506.

In at least one embodiment, supervised and/or unsupervised training can be performed by the client device 502 and/or the provider environment 506. In at least one embodiment, a set of training data 514 (e.g., classified or labeled data) is provided as input to function as training data. In at least one embodiment, training data can include instances of at least one type of object for which a neural network is to be trained, as well as information that identifies that type of object. In at least one embodiment, training data might include a set of images that each includes a representation of a type of object, where each image also includes, or is associated with, a label, metadata, classification, or other piece of information identifying a type of object represented in a respective image. Various other types of data may be used as training data as well, as may include text data, audio data, video data, and so on. In at least one embodiment, training data 514 is provided as training input to a training module 512. In at least one embodiment, training module 512 can be a system or service that includes hardware and software, such as one or more computing devices executing a training application, for training a neural network (or other model or algorithm, etc.). In at least one embodiment, training module 512 receives an instruction or request indicating a type of model to be used for training, in at least one embodiment, a model can be any appropriate statistical model, network, or algorithm useful for such purposes, as may include an artificial neural network, deep learning algorithm, learning classifier, Bayesian network, and so on. In at least one embodiment, training module 512 can select an initial model, or other untrained model, from an appropriate repository 516 and utilize training data 514 to train a model, thereby generating a trained model (e.g., trained deep neural network) that can be used to classify similar types of data, or generate other such inferences. In at least one embodiment where training data is not used, an appropriate initial model can still be selected for training on input data per training module 512.

In at least one embodiment, a model can be trained in a number of different ways, as may depend in part upon a type of model selected. In at least one embodiment, a machine learning algorithm can be provided with a set of training data, where a model is a model artifact created by a training process. In at least one embodiment, each instance of training data contains a correct answer (e.g., classification), which can be referred to as a target or target attribute. In at least one embodiment, a learning algorithm finds patterns in training data that map input data attributes to a target, an answer to be predicted, and a machine learning model is output that captures these patterns. In at least one embodiment, a machine learning model can then be used to obtain predictions on new data for which a target is not specified.

In at least one embodiment, training and inference manager 532 can select from a set of machine learning models including binary classification, multiclass classification, generative, and regression models. In at least one embodiment, a type of model to be used can depend at least in part upon a type of target to be predicted.

Graphics Processing Pipeline

In an embodiment, the PPU 300 comprises a graphics processing unit (GPU). The PPU 300 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 300 can be configured to process the graphics primitives to generate a frame buffer (e.g., pixel data for each of the pixels of the display).

An application writes model data for a scene (e.g., a collection of vertices and attributes) to a memory such as a system memory or memory 304. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the SMs 440 of the PPU 300 including one or more of a vertex shader, hull shader, domain shader, geometry shader, and a pixel shader. For example, one or more of the SMs 440 may be configured to execute a vertex shader program that processes a number of vertices defined by the model data. In an embodiment, the different SMs 440 may be configured to execute different shader programs concurrently. For example, a first subset of SMs 440 may be configured to execute a vertex shader program while a second subset of SMs 440 may be configured to execute a pixel shader program. The first subset of SMs 440 processes vertex data to produce processed vertex data and writes the processed vertex data to the L2 cache 460 and/or the memory 304. After the processed vertex data is rasterized (e.g., transformed from three-dimensional data into two-dimensional data in screen space) to produce fragment data, the second subset of SMs 440 executes a pixel shader to produce processed fragment data, which is then blended with other processed fragment data and written to the frame buffer in memory 304. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

Images generated applying one or more of the techniques disclosed herein may be displayed on a monitor or other display device. In some embodiments, the display device may be coupled directly to the system or processor generating or rendering the images. In other embodiments, the display device may be coupled indirectly to the system or processor such as via a network. Examples of such networks include the Internet, mobile telecommunications networks, a WIFI network, as well as any other wired and/or wireless networking system. When the display device is indirectly coupled, the images generated by the system or processor may be streamed over the network to the display device. Such streaming allows, for example, video games or other applications, which render images, to be executed on a server, a data center, or in a cloud-based computing environment and the rendered images to be transmitted and displayed on one or more user devices (such as a computer, video game console, smartphone, other mobile device, etc.) that are physically separate from the server or data center. Hence, the techniques disclosed herein can be applied to enhance the images that are streamed and to enhance services that stream images such as NVIDIA GeForce Now (GFN), Google Stadia, and the like.

Example Streaming System

Figure 6:
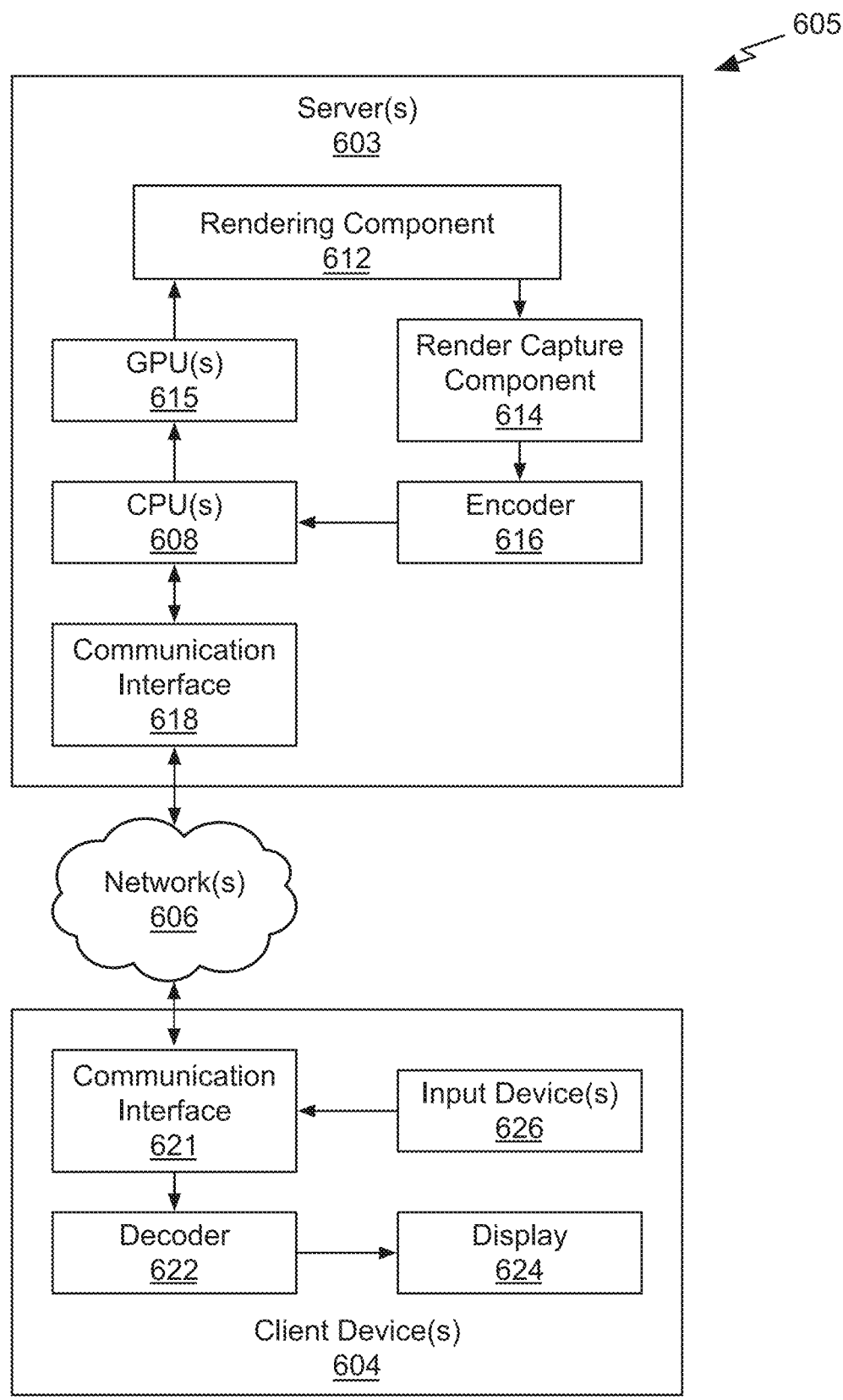
FIG. 6 illustrates an exemplary streaming system suitable for use in implementing some embodiments of the present disclosure.

FIG. 6 is an example system diagram for a streaming system 605, in accordance with some embodiments of the present disclosure. The streaming system 605 may be include one or more of the ECC and compressed data packing logic 100 or the ECC and compressed data correction logic 200. The streaming system 605 may include one or more of the data compression unit 110, ECC computation units 115 and 215, packing units 120 and 220, correction unit 205, or data decompression unit 210. The streaming system 605 may be configured to implement the method 150 or 260 shown in FIGS. 1E and 2D, respectively.

FIG. 6 includes server(s) 603 (which may include similar components, features, and/or functionality to the example processing system 500 of FIG. 5A and/or exemplary system 565 of FIG. 5B), client device(s) 604 (which may include similar components, features, and/or functionality to the example processing system 500 of FIG. 5A and/or exemplary system 565 of FIG. 5B), and network(s) 606 (which may be similar to the network(s) described herein). In some embodiments of the present disclosure, the system 605 may be implemented.

In an embodiment, the streaming system 605 is a game streaming system and the sever(s) 604 are game servers. In the system 605, for a game session, the client device(s) 604 may only receive input data in response to inputs to the input device(s) 626, transmit the input data to the server(s) 603, receive encoded display data from the server(s) 603, and display the display data on the display 624. As such, the more computationally intense computing and processing is offloaded to the server(s) 603 (e.g., rendering—in particular ray or path tracing—for graphical output of the game session is executed by the GPU(s) 615 of the server(s) 603). In other words, the game session is streamed to the client device(s) 604 from the server(s) 603, thereby reducing the requirements of the client device(s) 604 for graphics processing and rendering.

For example, with respect to an instantiation of a game session, a client device 604 may be displaying a frame of the game session on the display 624 based on receiving the display data from the server(s) 603. The client device 604 may receive an input to one of the input device(s) 626 and generate input data in response. The client device 604 may transmit the input data to the server(s) 603 via the communication interface 621 and over the network(s) 606 (e.g., the Internet), and the server(s) 603 may receive the input data via the communication interface 618. The CPU(s) 608 may receive the input data, process the input data, and transmit data to the GPU(s) 615 that causes the GPU(s) 615 to generate a rendering of the game session. For example, the input data may be representative of a movement of a character of the user in a game, firing a weapon, reloading, passing a ball, turning a vehicle, etc. The rendering component 612 may render the game session (e.g., representative of the result of the input data) and the render capture component 614 may capture the rendering of the game session as display data (e.g., as image data capturing the rendered frame of the game session). The rendering of the game session may include ray or path-traced lighting and/or shadow effects, computed using one or more parallel processing units—such as GPUs, which may further employ the use of one or more dedicated hardware accelerators or processing cores to perform ray or path-tracing techniques—of the server(s) 603. The encoder 616 may then encode the display data to generate encoded display data and the encoded display data may be transmitted to the client device 604 over the network(s) 606 via the communication interface 618. The client device 604 may receive the encoded display data via the communication interface 621 and the decoder 622 may decode the encoded display data to generate the display data. The client device 604 may then display the display data via the display 624.

It is noted that the techniques described herein may be embodied in executable instructions stored in a computer readable medium for use by or in connection with a processor-based instruction execution machine, system, apparatus, or device. It will be appreciated by those skilled in the art that, for some embodiments, various types of computer-readable media can be included for storing data. As used herein, a "computer-readable medium" includes one or more of any suitable media for storing the executable instructions of a computer program such that the instruction execution machine, system, apparatus, or device may read (or fetch) the instructions from the computer-readable medium and execute the instructions for carrying out the described embodiments. Suitable storage formats include one or more of an electronic, magnetic, optical, and electromagnetic format. A non-exhaustive list of conventional exemplary computer-readable medium includes: a portable computer diskette; a random-access memory (RAM); a read-only memory (ROM); an erasable programmable read only memory (EPROM); a flash memory device; and optical storage devices, including a portable compact disc (CD), a portable digital video disc (DVD), and the like.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A computer-implemented method, comprising:
   processing compressed data within a processor to compute error correction code check-bits;
   determining a number of fixed size storage units needed to store a combination of the compressed data and check-bits;
   combining the compressed data and the check-bits into the number of fixed size storage units to produce a combination; and
   transmitting the combination within the processor or to an additional device that is external to the processor.

2. The computer-implemented method of claim 1, further comprising
   determining that the number exceeds a maximum number of the fixed size storage units;
   removing the check-bits from the combination; and
   separately transferring the check-bits within the processor or to the additional device.

3. The computer-implemented method of claim 1, further comprising discarding the check-bits at an interface with the additional device and transmitting only the compressed data from the processor to the additional device.

4. The computer-implemented method of claim 1, further comprising storing the combination in a memory device at a location accessed by an address that is read or written using a single access request.

5. The computer-implemented method of claim 1, further comprising storing the compressed data in a first portion of a memory device and storing the check-bits in a second portion of the memory device that is separate from the first portion.

6. The computer-implemented method of claim 1, wherein the combination is transmitted from the processor to the additional device over an interconnect.

7. The computer-implemented method of claim 1, wherein the combination is transmitted through a crossbar interconnect within the processor.

8. The computer-implemented method of claim 1, wherein a second number of the fixed size storage units is needed to store the compressed data without the check-bits and the second number is less than the number of the fixed size storage units needed to store the combination.

9. The computer-implemented method of claim 1, wherein the error correction code check-bits are separately computed for a portion of the compressed data in each fixed size storage unit and combined in the fixed size storage unit with the portion of the compressed data.

10. A computer-implemented method of claim 1, wherein the combination is transmitted to a storage resource within the processor and further comprising:
    determining, based on the check-bits whether the compressed data is corrupted; and
    storing the combination in the storage resource, wherein, responsive to determining that the compressed data is corrupted, correcting the compressed data using the check-bits before storing the combination.

11. The computer-implemented method of claim 10, wherein the combination is transmitted to the storage resource through a crossbar interconnect within the processor.

12. The computer-implemented method of claim 10, further comprising:
    receiving, by an execution core within the processor, the combination from the storage resource;
    determining, by the execution core that the compressed data is corrupted based on the check-bits; and
    correcting the compressed data using the check-bits before processing the compressed data by the execution core.

13. The computer-implemented method of claim 1, further comprising:
    determining, by the additional device that the compressed data is corrupted; and
    correcting the compressed data using the check-bits before processing the combination within the additional device.

14. The computer-implemented method of claim 1, wherein at least one of the steps of processing, determining, and combining are performed on a server or in a data center to generate an image, and the image is streamed to a user device.

15. The computer-implemented method of claim 1, wherein at least one of the steps of processing, determining, and combining are performed within a cloud computing environment.

16. The computer-implemented method of claim 1, wherein at least one of the steps of processing, determining, and combining are performed for training, testing, or certifying a neural network employed in a machine, robot, or autonomous vehicle.

17. The computer-implemented method of claim 1, wherein at least one of the steps of processing, determining, and combining is performed on a virtual machine comprising a portion of a graphics processing unit.

18. A system, comprising:
a processor comprising an interface; and
an additional device that is external to the processor and connected to the interface, wherein the processor is configured to protect compressed data by:
processing the compressed data to compute error correction code check-bits;
determining a number of fixed size storage units needed to store a combination of the compressed data and check-bits; and
combining the compressed data and the check-bits into the number of fixed size storage units for transfer within the processor or to the additional device that is external to the processor.

19. The system of claim 18, further comprising transmitting the combination through a crossbar interconnect within the processor.

20. A non-transitory computer-readable media storing computer instructions that, when executed by one or more processors, cause the one or more processors to perform the steps of:
processing compressed data to compute error correction code check-bits;
determining a number of fixed size storage units needed to store a combination of the compressed data and check-bits; and
combining the compressed data and the check-bits into the number of fixed size storage units for transfer within a first processor of the one or more processors or to an additional device that is external to the first processor.

\* \* \* \* \*